(12) United States Patent
Holtkamp et al.

(10) Patent No.: US 8,398,355 B2
(45) Date of Patent: *Mar. 19, 2013

(54) LINEARLY DISTRIBUTED SEMICONDUCTOR WORKPIECE PROCESSING TOOL

(75) Inventors: William Holtkamp, Newark, CA (US); Izya Kremerman, Los Gatos, CA (US); Christopher Hofmeister, Hampstead, NH (US); Richard Pickreign, Harvard, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 187 days.

This patent is subject to a terminal disclaimer.

(21) Appl. No.: 11/442,511

(22) Filed: May 26, 2006

(65) Prior Publication Data

US 2007/0274810 A1 Nov. 29, 2007

(51) Int. Cl.
*H01L 21/677* (2006.01)
(52) U.S. Cl. .................. 414/217; 414/939
(58) Field of Classification Search .......... 414/217, 414/935
See application file for complete search history.

(56) References Cited

U.S. PATENT DOCUMENTS

| | | | |
|---|---|---|---|
| 3,294,670 A | 12/1966 | Charschan et al. | 204/298.25 |
| 4,518,078 A | 5/1985 | Garrett | 198/775 |
| 4,624,617 A | 11/1986 | Belna | 414/347 |
| 4,766,993 A | 8/1988 | Kita et al. | 198/619 |
| 4,794,863 A | 1/1989 | Gates et al. | 101/165 |
| 4,825,808 A | 5/1989 | Takahashi et al. | 118/719 |
| 4,836,733 A | 6/1989 | Hertel et al. | 414/744.5 |
| 4,917,556 A | 4/1990 | Stark et al. | 414/217 |
| 4,951,601 A | 8/1990 | Maydan et al. | 118/719 |
| 5,040,484 A | 8/1991 | Mears et al. | 118/503 |
| 5,076,205 A | 12/1991 | Vowles et al. | 118/719 |
| 5,202,716 A | 4/1993 | Tateyama et al. | 396/624 |
| 5,275,709 A | 1/1994 | Anderle et al. | 204/298.25 |
| 5,391,035 A | 2/1995 | Krueger | 414/217.1 |
| 5,417,537 A | 5/1995 | Miller | 414/217 |
| 5,538,390 A | 7/1996 | Salzman | 414/805 |
| 5,571,325 A | 11/1996 | Ueyama et al. | 118/320 |
| 5,586,535 A | 12/1996 | Syomura | 123/352 |
| 5,586,585 A | 12/1996 | Bonora et al. | 141/93 |
| 5,651,868 A | 7/1997 | Canady et al. | 204/298.25 |

(Continued)

FOREIGN PATENT DOCUMENTS

| | | |
|---|---|---|
| JP | 2-21740 | 2/1990 |
| JP | 2005243729 | 8/2005 |

(Continued)

OTHER PUBLICATIONS

Distributed Servo Products, Agile Systems, Inc. 3 pages.

(Continued)

*Primary Examiner* — Joshua Rudawitz
(74) *Attorney, Agent, or Firm* — Perman & Green, LLP; Colin C. Durham

(57) ABSTRACT

A substrate processing apparatus includes a transport chamber capable of holding an isolated atmosphere therein and communicably connected to a charging station for loading and unloading a substrate into the apparatus, a transport system inside the transport chamber for transporting the substrate and an array of processing chamber modules distributed alongside the transport chamber and communicably connected to the transport chamber to allow the substrate to be transferred therebetween.

24 Claims, 16 Drawing Sheets

U.S. PATENT DOCUMENTS

| | | | |
|---|---|---|---|
| 5,655,277 A | 8/1997 | Galdos et al. | 29/33 P |
| 5,695,564 A | 12/1997 | Imahashi | 118/719 |
| 5,700,127 A | 12/1997 | Harada et al. | 414/416 |
| 5,788,447 A | 8/1998 | Yonemitsu et al. | 414/217 |
| 5,882,165 A | 3/1999 | Maydan et al. | 414/217 |
| 5,894,760 A | 4/1999 | Caveney | 74/490.03 |
| 5,897,710 A | 4/1999 | Sato et al. | 427/8 |
| 5,989,346 A | 11/1999 | Hiroki | 118/719 |
| 6,002,840 A | 12/1999 | Hofmeister | 700/245 |
| 6,017,820 A | 1/2000 | Ting et al. | 438/689 |
| 6,053,980 A | 4/2000 | Suda et al. | 118/719 |
| 6,066,210 A | 5/2000 | Yonemitsu et al. | 118/719 |
| 6,155,131 A | 12/2000 | Suwa et al. | 74/490.05 |
| 6,183,615 B1 | 2/2001 | Yasar et al. | 204/298.26 |
| 6,261,048 B1 | 7/2001 | Muka | 414/416 |
| 6,296,735 B1 | 10/2001 | Marxer et al. | 156/345.32 |
| 6,297,611 B1 | 10/2001 | Todorov et al. | 318/568.21 |
| 6,318,951 B1 | 11/2001 | Schmidt et al. | 414/744.5 |
| 6,364,592 B1 | 4/2002 | Hofmeister | 414/217 |
| 6,425,722 B1 | 7/2002 | Ueda et al. | 414/217 |
| 6,468,021 B1 | 10/2002 | Bonora et al. | 414/522 |
| 6,503,365 B1 | 1/2003 | Kim et al. | 156/345.32 |
| 6,519,504 B1 | 2/2003 | Soraoka et al. | 700/228 |
| 6,634,845 B1 | 10/2003 | Komino | 414/217 |
| 6,641,350 B2 | 11/2003 | Nakashima et al. | 414/217 |
| 6,719,517 B2 * | 4/2004 | Beaulieu et al. | 414/217 |
| 6,841,485 B1 * | 1/2005 | Inoue et al. | 438/716 |
| 6,852,194 B2 | 2/2005 | Matsushita et al. | 156/345.32 |
| 6,918,731 B2 | 7/2005 | Talmer | 414/217 |
| 6,962,471 B2 | 11/2005 | Birkner et al. | 414/217 |
| 7,090,741 B2 | 8/2006 | Narushima et al. | 156/345.26 |
| 7,607,879 B2 * | 10/2009 | Hall et al. | 414/217 |
| 2001/0026748 A1 | 10/2001 | Blonigan et al. | 414/217 |
| 2002/0044860 A1 | 4/2002 | Hayashi et al. | 414/416.03 |
| 2002/0089237 A1 | 7/2002 | Hazelton | 310/12 |
| 2002/0150448 A1 | 10/2002 | Mizokawa et al. | 414/217 |
| 2002/0192056 A1 | 12/2002 | Reimer et al. | 414/217 |
| 2003/0129045 A1 | 7/2003 | Bonora et al. | 414/217 |
| 2004/0151562 A1 | 8/2004 | Hofmeister et al. | 414/217 |
| 2005/0105991 A1 | 5/2005 | Hofmeister et al. | 414/217 |
| 2005/0111938 A1 | 5/2005 | Van der Meulen | 414/217 |
| 2005/0111956 A1 | 5/2005 | Van der Meulen | 414/744.2 |
| 2005/0113964 A1 | 5/2005 | Van der Meulen | 700/213 |
| 2005/0113976 A1 | 5/2005 | Van der Meulen | 700/245 |
| 2005/0118009 A1 | 6/2005 | Van der Meulen | 414/744.1 |
| 2005/0120578 A1 | 6/2005 | Van der Meulen | 34/92 |
| 2005/0223837 A1 | 10/2005 | Van der Meulen | 74/490.01 |

FOREIGN PATENT DOCUMENTS

| | | |
|---|---|---|
| WO | WO97/27977 | 7/1997 |
| WO | WO03/038869 | 8/2003 |

OTHER PUBLICATIONS

"A Low Cost USB-CAN Distributed Motion Control System", Circuit Cellular Website, 8 pages.

"Distributed Motion Control . . . ", Chris Rand, Engineeringtalk Website, 2 pages.

"Rorze Products Overview", RR-713 Robot, Rorze Automation Products Website, 2 pages.

"Semiconductor Equipment Design for Short Cycle Time Manufacturing", Future Fab International Website, Yoshinobu Hayashi et al., 9 pages.

International SEMA TECH 13001 Factory Guidelines: Version 5.0, 139 pages.

"Fundamentals of Modern Manufacturing", Materials, Processes, and Systems, Second Edition, Mikell P. Groover, 14 pages.

"The Automated Semiconductor Fabricator, Circa 2020", Mitchell Weiss, 2 pages.

ITRS 2001 Factory Integration Chapter, "Material Handling Backup System", 2005, ITRS Factory Integration Twg, 46 pages.

Daifunku America Corporation, "Cleanway 700 CLW-700", 1 page.

Daifunku America Corporation, Cleanway 600 CLW-600, 1 page.

"Semiconductor Equipment for Short Cycle Time Manufacturing", Yoshinobu Hayashi, Tokyo Electron Ltd. 5 Pages.

"Silicon Wafer Transport in a High Vacuum, Microgravity Environment", from Professor Glenn Chapman's Home Page, 24 Pages.

Product Description of "Ferrofluidic Sealing Sub-Assemblies", Ferrotec USA, 3 pages.

"Linear Motor Robots Finding Varied Applications . . . 3 pages".

"Industrial Robotics; Technology Programming and Applications", Mikel Groover et al., 16 pages.

"Flexible Material Handling Automation in Wafer Fabrication", James P. Harper et al., Veeco Integrated Automation, Inc. 6 pages.

Excerpted Pages From Manufacturing Engineering and Technology, Third Edition, 4 pages.

Ulvac Product Description of In-Line Sputter Systems New SDP-s Series, 1 page.

* cited by examiner

LINEARLY DISTRIBUTED SEMICONDUCTOR WORKPIECE PROCESSING TOOL

BACKGROUND

1. Field of the Exemplary Embodiments

The exemplary embodiments described herein relate to semiconductor workpiece processing tools and, more particularly, to processing tools having a linear arrangement.

2. Brief Description of Related Developments

One of the factors affecting consumer desire for new electronic devices naturally is the price of the device. Conversely, if the cost, and hence the price of new electronic devices can be lowered, it would appear that a beneficial effect would be achieved in consumer desires for new electronic devices. A significant portion of the manufacturing costs for electronic devices is the cost of producing the electronics which starts with the manufacturing and processing of semi-conductor substrates such as used in manufacturing electronic components, or panels used for making displays. The cost of processing substrates is affected in part by the cost of the processing apparatus, the cost of the facilities in which the processing apparatus are housed, and in large part by the throughput of the processing apparatus (which has significant impact on unit price). As can be immediately realized, the size of the processing apparatus itself impacts all of the aforementioned factors. However, it appears that conventional processing apparatus have reached a dead end with respect to size reduction. Moreover, conventional processing apparatus appear to have reached a limit with respect to increasing throughput per unit. For example, conventional processing apparatus may use a radial processing module arrangement. A schematic plan view of a conventional substrate processing apparatus is shown in FIG. 9. As can been seen, the processing modules of the apparatus in FIG. 9 are placed radially around the transport chamber of the processing apparatus. The transport apparatus, which is a conventional two or three axis of movement apparatus (e.g. Z, θ, T Axis) is centrally located in the transport chamber to transport substrates between processing modules. As can be realized from FIG. 9, throughput of the conventional processing apparatus is limited by the handling rate of the transport apparatus. In other words, throughput cannot be increased with the conventional apparatus by merely adding processing modules to the apparatus, because once the transport apparatus reaches a handling rate peak, this becomes the controlling factor for throughput. The apparatus of the present invention overcome the problems of the prior art as will be described further below.

SUMMARY OF THE EXEMPLARY EMBODIMENTS

In accordance with an exemplary embodiment, a substrate processing apparatus is provided. The substrate processing apparatus includes a transport chamber capable of holding an isolated atmosphere therein and communicably connected to a charging station for loading and unloading a substrate into the apparatus, a transport system inside the transport chamber for transporting the substrate and an array of processing chamber modules distributed alongside the transport chamber and communicably connected to the transport chamber to allow the substrate to be transferred therebetween. Wherein, the transport chamber is capable of being linearly elongated longitudinally and includes at least one transport chamber node, each of which is capable of being communicably connected in series to at least another transport chamber node of the transport chamber for effecting the elongation, and of tying at least two chamber modules of the apparatus to each other, each node having a resident substrate transport arm therein for transporting the substrate between the transport chamber node and the at least two chamber modules and a substrate buffer, communicably connected to the at least one transport chamber node, buffering the substrate.

In accordance with another exemplary embodiment, a substrate processing apparatus is provided. The substrate processing apparatus includes a transport chamber with an opening for loading and unloading a substrate to and from the transport chamber, the transport chamber comprising a first transport chamber module, a second transport chamber module and a third transport chamber module, each of which is capable of holding an isolated atmosphere therein and is communicably connectable to each other for transferring the substrate therebetween, and when the first and second transport chamber modules are connected to each other, the transport chamber has a longitudinal linearly elongated shape. The processing apparatus further includes a transport system located in the transport chamber and having a substrate transport arm movably mounted in a longitudinally fixed location within each of the first, second and third transport chamber modules, an array of processing chamber modules distributed alongside the transport chamber and communicably connected to the transport chamber to allow the substrate to be transferred therebetween and at least one substrate buffer module selectably connectable to at least one of the first, second or third transport chamber modules, wherein the longitudinal linearly elongated shape of the transport chamber has a selectably variable longitudinal length effected by selectable connection of at least one of the second and the third transport chamber modules to the first transport chamber module, wherein selectable connection of the third transport chamber module to either the first or second transport chamber modules depends on the substrate buffer module being connected between the first and second transport chamber modules.

In accordance with still another exemplary embodiment, a substrate processing apparatus is provided. The substrate processing apparatus includes a charging station with a port for loading and unloading a substrate from the apparatus, a transport chamber capable of holding an isolated atmosphere therein and communicably connected to the charging station to allow passage of the substrate in between, a transport system inside the transport chamber for transporting the substrate and an array of processing chamber modules distributed alongside the transport chamber and communicably connected to the transport chamber to allow the substrate to be transferred therebetween. Wherein, the transport chamber is capable of being linearly elongated longitudinally and includes at least one transport chamber module, with an always resident substrate transport arm therein, the transport chamber module being interfaced and communicably connected to the charging station and capable of being communicably connected to at least another transport chamber module so that the charging station, the at least one transport chamber module and the at least another transport chamber module are arranged in series longitudinally and a pass through substrate buffer, interfaced and communicably connected to the at least one transport chamber module so that the at least one transport chamber module is interposed between the charging station and the at least one transport chamber module.

In accordance with yet another exemplary embodiment a substrate processing apparatus is provided. The substrate processing apparatus includes a transport chamber module with a chamber capable of being isolated from outside atmosphere, and having a transport arm mounted inside the chamber, the transport arm having an end effector for holding and transporting a substrate, and having a pivot joint located in a substantially fixed location relative to the transport chamber module. The substrate processing apparatus further includes another transport chamber module, with another chamber capable of being isolated from outside atmosphere, and having another transport arm mounted inside the other chamber, the other transport arm having another end effector for holding and transporting the substrate, and having another pivot joint located in a substantially fixed location relative to the other transport chamber module, the other transport chamber module being connectable to the chamber module to form a linearly elongated transport chamber and a linear array of processing modules extending along and connected to the linearly elongated transport chamber so that the substrate may be transported between the linearly elongated transport chamber and at least one processing module of the linear array. Wherein, the transport arm and the other transport arm cooperate with each other to form a travel lane, extending longitudinally through the linearly elongated transport chamber, along which the substrate is transported.

BRIEF DESCRIPTION OF THE DRAWINGS

The foregoing aspects and other features of the present invention are explained in the following description, taken in connection with the accompanying drawings, wherein:

FIG. 4B is another schematic elevation view of the transport chamber in accordance with another exemplary embodiment;

DETAILED DESCRIPTION OF THE EXEMPLARY EMBODIMENT(s)

Figure 2:
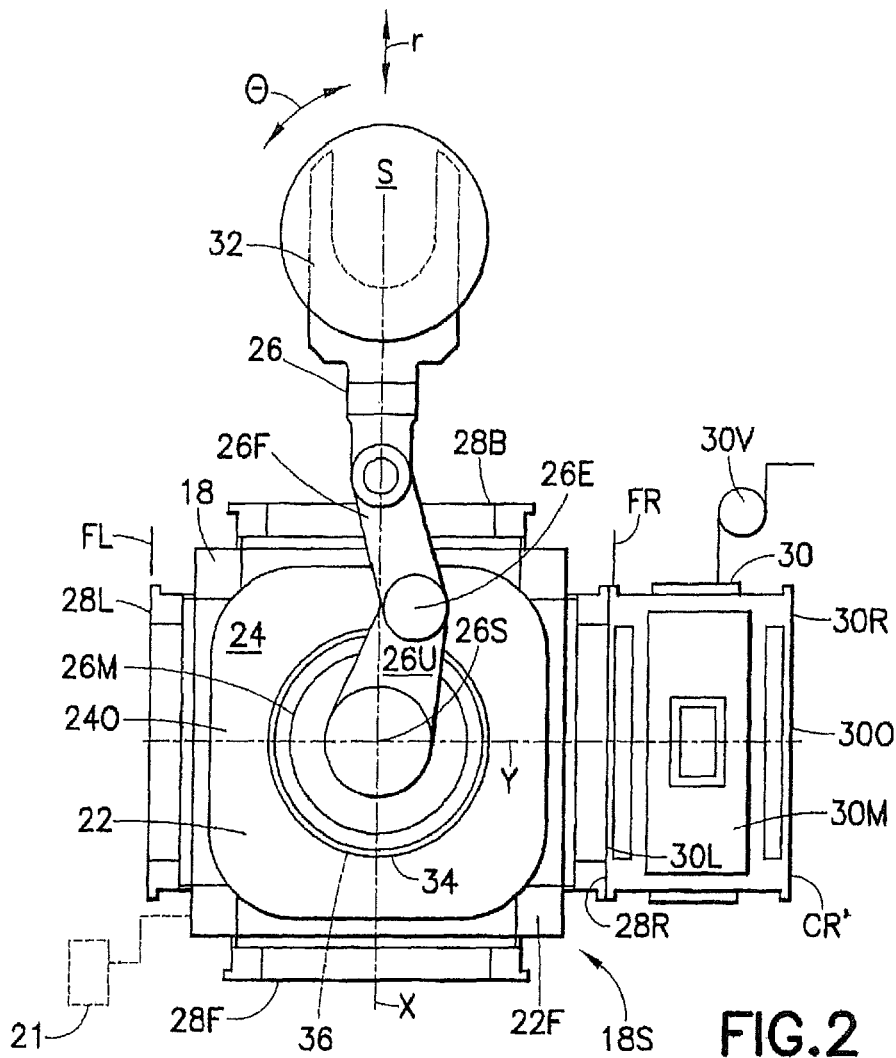
FIG. 2 is a schematic plan view of a transport chamber module of the processing apparatus in FIG. 1.

Referring to FIG. 2, there is shown a schematic plan view of a substrate processing apparatus 10 incorporating features of the present invention. Although the present invention will be described with reference to the embodiments shown in the drawings, it should be understood that the present invention can be embodied in many alternate forms of embodiments. In addition, any suitable size, shape or type of elements or materials could be used.

The workpiece processing system 10, or tool, generally has a processing section 13 and an interface section 12. The interface and processing sections of the tool 10 are connected to each other and allow transport of workpieces in between. The workpieces S illustrated in the figures are exemplary and may be for example 450 mm, 300 mm, or 200 mm wafers, reticles, mask, flat panels for displays, or any other desired workpiece item. The processing section 13 of the tool may have processing modules or chambers, such as material deposition (CVD, PVD, copper implantation, epitaxial silicon, dielectric deposition, rapid thermal processing, ion implantation, etching, chemical mechanical polishing, metrology, electroplating, etc.) for processing the workpieces S in accordance with a desired processing protocol. The processing modules may be linked by a workpiece transport chamber 16 (see also FIG. 5) in which the workpieces may be transported between desired processing modules according to the processing protocol. The transport chamber has a transport robot 20 capable of moving the workpieces therein and to the process modules. The process modules and the transport chamber are capable of being atmospherically isolated from the exterior atmosphere in order to maintain atmosphere within the transport chamber the same as the processing modules, or suitable for workpieces being transferred between processing modules. For example, the transport chamber may have an inert gas (e.g. $N_2$) atmosphere or may hold a vacuum (or near vacuum atmosphere). The tool interface section 12 provides a workpiece loading/unloading interface between the tool processing section 13 and its isolatable atmosphere and the tool exterior. The tool interface section thus allows workpieces, that may be transported in carriers outside the tool, to be unloaded from the carrier into the tool and vice versa. The transport chamber may be made up of transport chamber modules, that may be connected end to end for example to form a linearly elongated transport chamber. The transport chamber length is thus variable by adding or removing transport chamber modules. The transport chamber modules may have entry/exit gate valves capable of isolating desired transport chamber module from adjoining portions of the transport chambers. Tool interface sections similar to section 12 may be positioned at any desired locations along the linearly elongated transport chamber as will be described below, allowing workpieces to be loaded or unloaded at a desired location in the tool. Processing modules may be distributed along the length of the transport chamber. The processing modules may be stacked in a direction angled to the length of the chamber. The transport chamber modules may have entry/exit gate valves to isolate desired transport chamber modules from the processing modules. The transport system 20 is distributed through transport chamber. A number of the transport chamber modules may each have an integral movable arm having a fixed interface/mount to the module and movable end effector capable of holding and moving workpieces linearly along the transport chamber and between transport chamber and process modules. Transport arms in different transport chamber modules may cooperate to form at least a portion of the linearly distributed transport system. Operation of the transport system, processing modules, processing section, interface section and any other portions of the tool may be controlled by controller 400. Controller 400, depicted schematically in FIG. 1, may have a distributed or clustered control architecture, a suitable example of which is described and shown in U.S. application Ser. No. 11/178,615, filed Jul. 11, 2005 incorporated by reference herein in its entirety. The transport chamber and transport system therein may be arranged to define multiple workpiece travel lanes within the transport chamber as will be described in greater detail below. The travel lanes may be polarized or dedicated within the transport chamber for advance and return of workpieces. The transport chamber may also have intermediate load locks allowing different sections of the transport chamber to hold different atmospheres, and allow workpieces to transit between the different atmospheric sections of the transport chamber. As will be described below, the transport chamber may have an entry/exit station(s), where workpieces may be inserted/removed from a desired location of the transport chamber. For example, the entry/exit station may be located at an opposite end from the interface section 12 or other desired position in the transport chamber. The entry exit station(s) of the transport chamber may communicate with a workpiece express transit passage linking entry/exit station of the transport chamber with a remote tool interface section 12 (see also FIGS. 5 and 8). The express transit passage may be independent of and isolatable from the transport chamber 16. The express transit passage may communicate with one or more of the interface section 12 so that workpieces may be transported between the interface section and transit passage. Workpieces, may be rapidly placed into an advanced section of the tool and returned to the interface section 12 after processing via the express transit passage, without affecting the transport chamber, and resulting in a reduction of work in process (WIP). The transport chamber may also have intermediate entry/exit stations, a number of which may communicate with the express transit passage so that workpieces may be transported therebetween. This allows workpieces to be inserted or removed at desired intermediate portions of the process without affecting the process stream as will be described further below.

Figure 1:
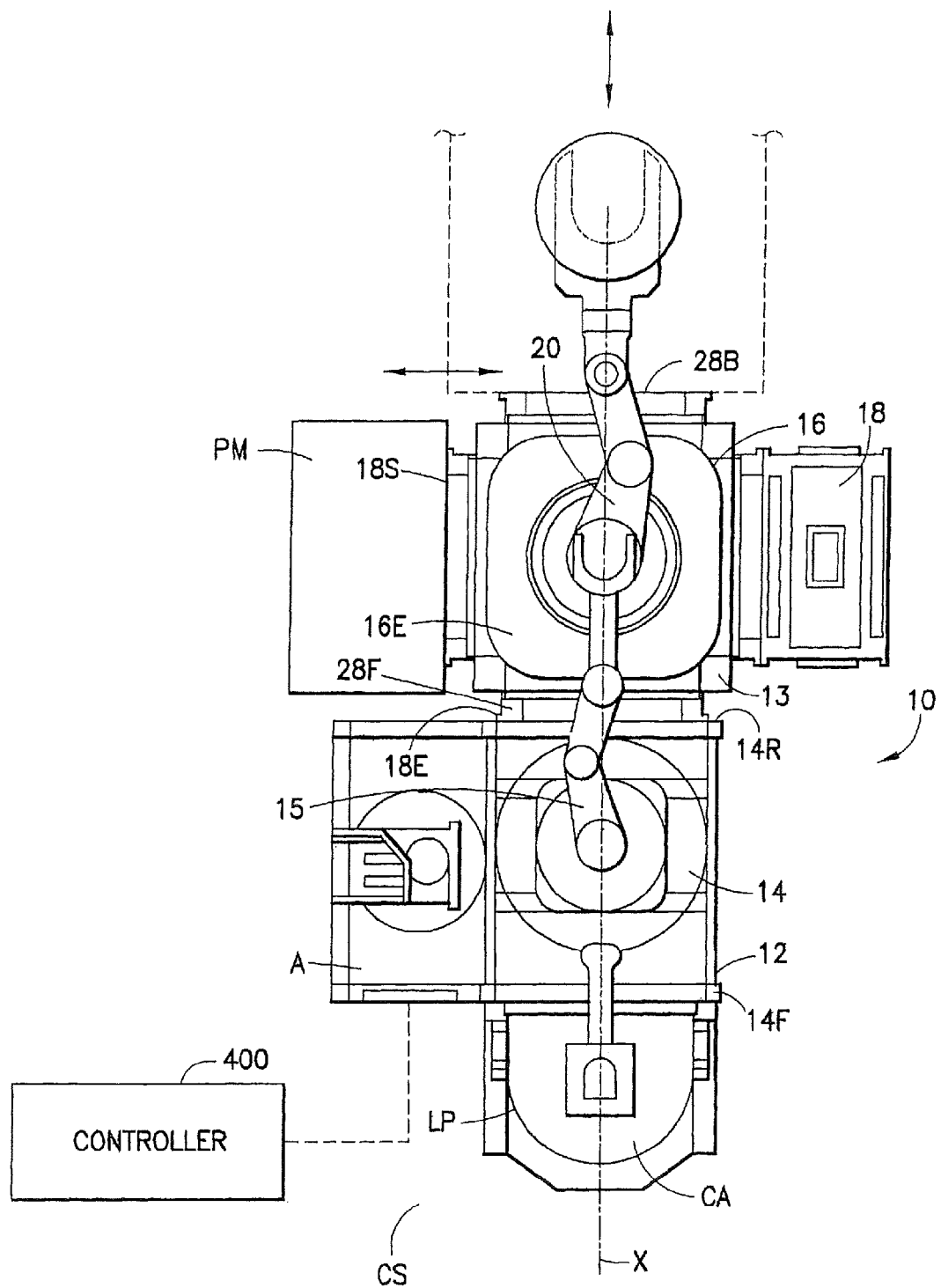
FIG. 1 is a schematic plan view of a substrate processing apparatus incorporating features of the present invention in accordance with a first exemplary embodiment.

Referring still to FIG. 1, the interface section 12 is shown for example purposes at an end of the transport chamber of the tool 10. In alternate embodiments, the interface section of the tool may be located as desired including for example at an intermediate location along the transport chamber, between the ends of the transport chamber. Though FIG. 1 shows a tool 10 with one interface section connected to the transport chamber. In alternate embodiments, the tool may have any desired number of interface sections connected to the transport chamber. The interface section 12 shown in FIG. 1 has an exemplary configuration and in alternate embodiments the interface section may have any desired configuration/arrangement. The interface section 12 generally has a closure or chamber 14 and a load port(s) LP (one is shown for example purposes only and the chamber may have any desired number of loadports). The chamber 14 is communicably connected with the transport chamber 16 so that workpieces may be transported between interface section chamber 14 and transport chamber 16. The chamber 14 of the interface section may be an environmental module, with a controlled air system for example having fan(s) and particulate filter(s) to maintain desired cleanliness conditions within chamber 14. The interface section chamber may be referred to as the environmental chamber. The load port LP provides a controlled port (not shown) through which workpieces may be loaded and unloaded from the chamber 14 of the interface section without compromise of the controlled environmental conditions and environment inside the environmental chamber 14. A load lock (not shown in FIG. 1, but see FIG. 4) may be provided to transition between environmental chamber 14 and transport chamber 16. An example of a suitable environmental interface section is disclosed in U.S. patent application Ser. No. 11/178,836, filed Jul. 11, 2005 incorporated by reference herein in its entirety. In the embodiment shown, the controlled port of the load port provides an opening into the interface section through which workpieces are transported into and out of the interface section, and hence, into and out of the tool 10. The controlled port opening may have a door or closure (not shown) closing, or at least partially blocking the opening, to maintain the controlled environment in the interface section 12 when workpieces are not being loaded/unloaded from the interface section. The port door is closed when workpieces are not being loaded/unloaded. In the embodiment shown, the workpieces may be transported outside the tool inside carriers or containers such as FOUP(S), SMIF(s) or other workpiece container. FIG. 1 shows a FOUP C mated to the load port. In alternate embodiments, the load port may be arranged to mate with any desired carrier. As may be realized from FIG. 1, when the workpiece container C is mated to the load port, the container may be sealed to the controlled port of the load port, so that the port door may be opened. With the port sealed by the container, the port door, and the closure (not shown) of the container C (closing the container opening through which workpieces are loaded into the container) may be removed, for example simultaneously without exposure of potentially contaminated closure surfaces to the chamber interior, thereby opening the container C to the environmental chamber 14. In the embodiment shown in FIG. 1, the environmental chamber 14 is connected to transport chamber 16 at chamber face 14R, and the load port LP is located on the opposite chamber face 14F. The load port LP may have a container support CS for supporting container (s) mated to the load port. In the embodiment shown in FIG. 1, the container support CS extends from chamber face 14F, and the transport chamber 16, environmental chamber 14 and load port LP are arranged substantially in line along axis X for example purposes. In alternate embodiments, the transport chamber environmental chamber and load port may not be aligned. For example, the load port (and its container support) may be located on a face of the environmental chamber that positions the load port transverse or angled to the alignment axis of the interface section and transport chamber. As may be realized, the container support may be positioned to allow container interface with a suitable automated container transport system (not shown), such as an overhead or floor mounted automated material handling system (AMHS), a conveyor system or autonomous or rail guided vehicles. Containers may also be loaded manually on the load port container support. The workpiece containers may be reduced WIP containers suitable examples of which are described and shown in U.S. patent application Ser. No. 11/207,231, filed Aug. 19, 2005, incorporated by reference herein in its entirety. The load port door and container closure may be passive, (i.e. passive locking features without movable features), suitable examples of which are described and shown in U.S. patent application titled "Reduced Capacity Carrier, Transport, Load Port, Buffer System", filed Nov. 3, 2005. In the embodiment where the port door is passive, the interface section chamber may be for example connected to suitable environmental control systems (e.g. suction source/roughing pump, vent to atmosphere, vent to transport chamber) to allow the interface section to operate as a load lock (i.e. capable of transition between the atmosphere inside the transport chamber 16 and that of the workpiece container C). In this embodiment, the interface section 12 mates directly to the transport chamber (as shown in FIG. 1) without any intervening load locks. In the exemplary embodiment shown in FIG. 1, the interface section has a workpiece transport 15 for moving workpieces from the container C mated to the load port, to the transport chamber 16. The transport 15 is located inside the interface section chamber 14, and may have for example multiple independently movable end effectors for independently moving multiple workpieces. In the embodiment shown in FIG. 1 the transport 15 is illustrated for example as a multi-articulated link arm, that may have three (3), four (4), five (5) or six (6) degrees of freedom (for example two independently movable end effectors (θ, r) and combined Z motion). In alternate embodiments, the interface section may be provided with any suitable workpiece transport apparatus. In the exemplary embodiment shown, the interface section may also include workpiece station(s) A such as an aligner station, buffer station, metrology station and any other desired handling station for workpiece(s) S.

Referring now to FIG. 2, there is a schematic plan view of an exemplary transport chamber module 18 of the workpiece transport chamber 16. As will be described in greater detail below, module 18 may have multiple interfaces, for mating for example to interface sections (similar to section 12), load lock modules, process modules, workpiece station modules, other transport chamber modules, or any other desired module, and may have an integral workpiece transport apparatus arranged in the module to provide multiple independent travel lanes for workpiece(s) S within the individual module and between the individual module and adjoining transport chamber modules. The transport chamber module 18 has a casing 24 that is capable of holding an isolated atmosphere as will be described below. In the embodiment shown, the casing 24 has a generally hexahedron shape, though in alternate embodiments the casing may have any suitable shape, (e.g. more or fewer lateral sides or round perimeter). The casing 24 may include a frame 22F for structural support of module systems and components. In the exemplary embodiment, the frame may be a one piece member (i.e. unitary construction) made of metal such as stainless steel or aluminum alloy, and formed by any suitable forming process, such as forging. A suitable example of a chamber casing is disclosed in U.S. patent application Ser. No. 11/070,443, filed Mar. 2, 2005, incorporated by reference herein in its entirety. In this exemplary embodiment, the frame 22F may define portions of the casing (e.g. pressure boundaries) that isolate the interior chamber atmosphere from the exterior atmosphere. The frame may also define the mating surfaces of the module interfaces and openings in the casing for communication and workpiece passage to adjoining modules. The frame may further define access openings 24O for user accessing the interior of the module as will be described below. In alternate embodiments, the casing frame of the transport chamber module may have any other desired shape and arrangement.

As seen in FIG. 2, the casing 24 of the transport chamber module in this exemplary embodiment has interfaces 28F, 28B, 28L, 28R on lateral sides of the casing. In alternate embodiments, there may be more or fewer interfaces. The module casing 24, and the interfaces 28F, 28B, 28L, 28R thereon, are shown as being substantially symmetrical with respect to both axes of symmetry X, Y. Moreover, the interfaces 28F, 28B, 28L, 28R may be similar to each other. This allows the module 18 to be joined to other portions/modules of the transport chamber in any orientation. Thus, for example, the module may be oriented to present interfaces 28F, 28B for mating to adjoining transport chamber modules (see for example FIGS. 1 and 3). In alternate embodiments, the orientation of the module may be rotated (in this example about 90°) so that interfaces 28L, 28R may mate to other in line transport chamber modules. Conversely, the arrangement symmetry of the interfaces on the module casing and the similarity of the individual interfaces to each other allows any module having a complementing mating interface to be mated to any interface of the transport chamber module 18. Thus, any desired module having a complementing mating interface, such as another transport module or a process module, may be mated/joined to any one of the mating interfaces 28L, 28R, 28F, 28B of any given transport chamber module similar to module 18. For example, in a given linearly distributed tool, one transport chamber module 18 may have another transport chamber module mated to interface 28R, and the other transport chamber module may be mated to a process module PM at an interface similar to interface 28R, but mated to yet another transport chamber module at an interface similar to interface 28F. This will be described in greater detail below.

Figure 12:
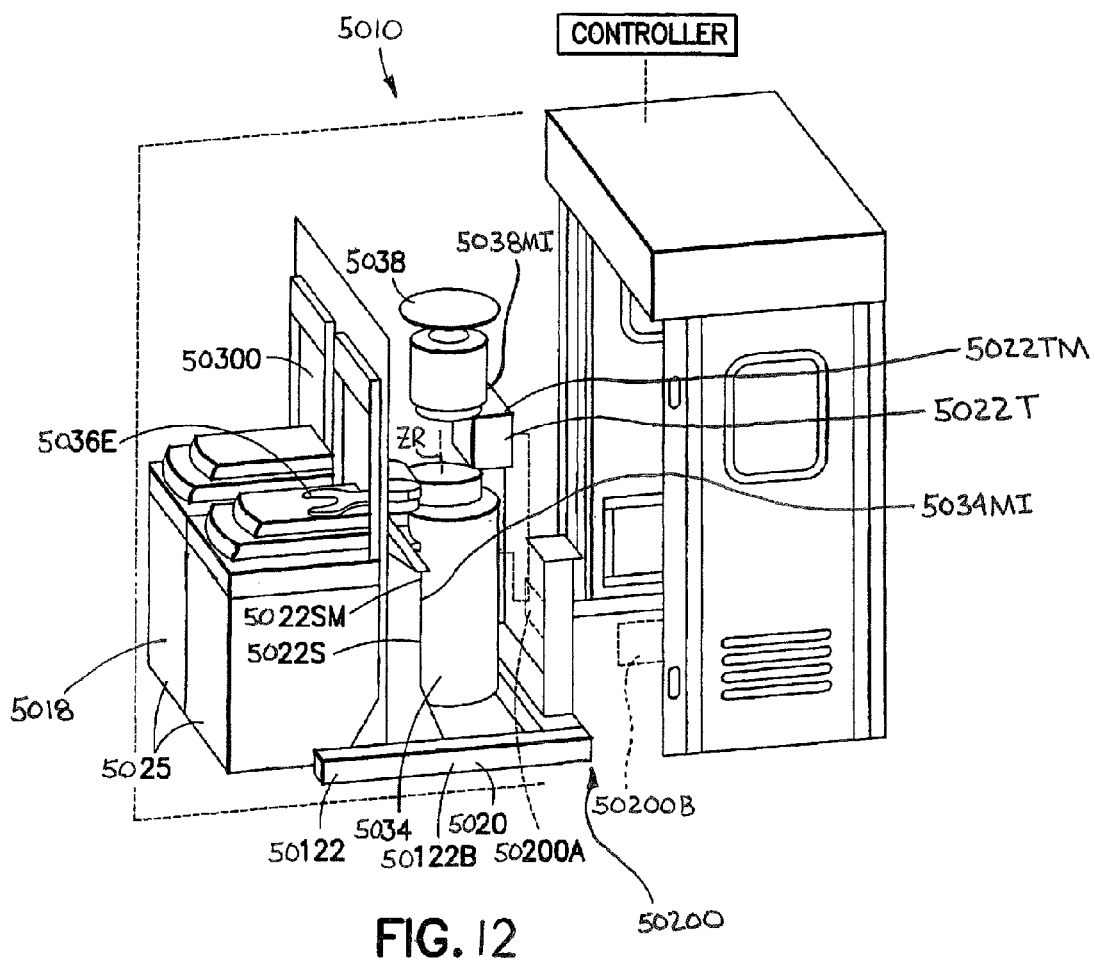
FIG. 12 is a perspective view of a portion of the processing apparatus in FIG. 11 showing a removable section of the apparatus in a removed position.

The module casing 24 and interfaces 28L, 28R, 28F, 28B may also be arranged to provide true interchangeability between modules. For example, each interface 28L, 28R, 28F, 28B may be provided with position and inclination control surfaces and features, schematically represented in FIG. 2 as lines FL, FR (only lines FL, FR are shown in FIG. 2 for example purposes). The position and inclination surfaces and features FL, FR on the module may be of any suitable kind, such kinematic coupling features, suitable examples of which are described and shown in U.S. patent application Ser. No. 11/154,787, filed Jun. 15, 2005 (now U.S. Pat. No. 7,607,879), incorporated by reference herein in its entirety. For example, the control features will be described with respect to processing apparatus 5010 as described in U.S. Pat. No. 7,607,879. Referring to FIGS. 11-15, the processing apparatus 5010 includes control features (i.e. positioning system 200), such as the control features FL, FR noted above, for repeatably positioning an automation engine of a movable portion 5018 to the rest of the tool. As shown in FIG. 12, the positioning system 50200 has conjugal, or otherwise interfacing portions 50200A, 50200B respectively on the movable section 5018 and the other (non-movable/rear section 5014) of the apparatus. Mounting interface portion 50200B defines the positioning reference basis/datum on the apparatus 5010, and mating portion 50200A on the movable section interfaces with the portion 50200B to locate the automation engine. The automation engine, by virtue of the location of the automation components 5034, 5038, which will be described in greater detail below, is positioned so that upon interfacing of portion 50200A, 50200B of the positioning system, when the movable section is brought to its installed portion, the automation engine is in a repeatable location independent of variances in the structure of the movable section 5018. In other words, the automation components on the movable section 5018, and hence the automation engine defined thereby, are positioned based upon positioning system 50200, and independent of the structure of the movable section. This provides true interchangeability of the automation engines between different processing apparatus similar to apparatus 2010 without regard to dimensional variances in the structure of the movable sections themselves.

Figure 13A:
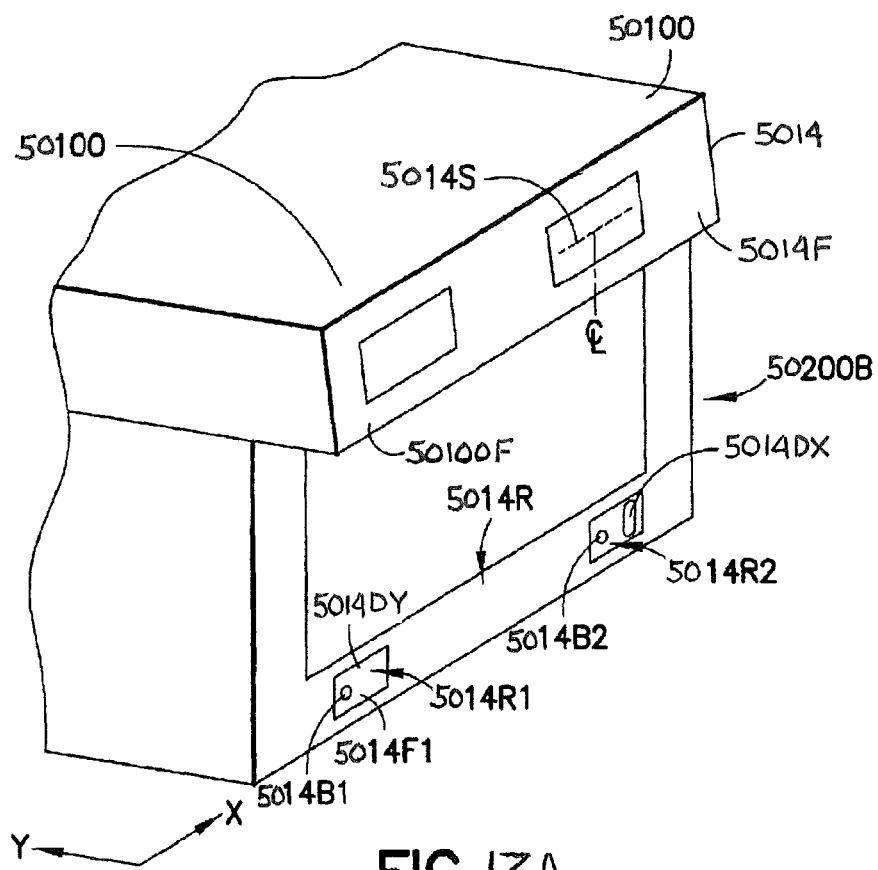
FIG. 13A is a schematic partial perspective view of the processing apparatus in FIG. 11.

Referring now to FIG. 13A, there is shown a front face 5014F of the rear section 5014 of the apparatus 5010. The front face 5014F has the mounting interface portion 50200B located thereon. In this exemplary embodiment, the front face 5014F of the rear section 5014 has been established for example purposes at the mating face of the processing tool (for example the mating interface of load locks 50100, see FIG. 11). In alternate embodiments, the front face of the rear section, or the reference face with the reference datum for locating the automation engine relative to the apparatus, may be established as desired on the rear section or non-movable portion of the front section of the apparatus. Mounting interface portion 50200B includes reference datum 5014R. Mounting interface portion 50200B may also generally include mechanical and other interfaces or couplings (e.g. communication or power system couplings) for connecting the movable section 5018, when in the installed position, to the non-movable portion of the tool 5010 as noted above, and as will also be further described below. As may be realized, the reference datum 5014R defines the position constraints for locating the automation engine on the movable section 5018 to the rest of the tool when the movable section is brought to its installed position. In the exemplary embodiment shown in FIG. 13A, reference datum 5014R has Y and X reference datums $5014R_1$, $5014R_2$ respectively establishing Y and X constraints 5014DY, 5014DX. In alternate embodiments the reference datum on the non-movable portion of the apparatus may define more or fewer position constraints. The reference datums $5014R_1$, $5014R_2$, and hence the position constraints 5014DY, 5014DX defined thereby, may be located in a known relation to desired references of the apparatus. By way of example, the Y reference $5014R_1$ may be placed at a known distance from the front face 50100F of the slot valve for load lock 50100. This may be an appropriate reference of the apparatus 5010 in relation to which the positioning Y reference $5014R_1$ may be located because it is an interface that exists between the automation engine (in particular the transport apparatus 5034) and the other portions of the apparatus 5010.

The interface may be a control interface and is independent of the dimensional variances between different apparatus similar to apparatus 5010 generated during fabrication. In alternate embodiments any other desired reference of the apparatus may be used for locating the Y position reference $5014R_1$. The X reference $5014R_2$, may be placed at a known distance from for example a center line CL of the slot valve for load lock 50100, (another independent reference) though any other desired X reference may be used. The Y and X references $5014R_1$, $5014R_2$ may be repeatedly located, at the known distance from the desired apparatus references, for each apparatus similar to apparatus 5010 by using a fixture tool or other precision locating systems such as an optical or electro-optical locating system. Accordingly, the Y and X references, similar to references $5014R_1$, $5014R_2$, of each apparatus, similar to apparatus 5010, are located with respect to common references of the apparatus at a repeatable location with substantially no variance between locations on different apparatus. Thus, the Y constraint 5014DY, defined by Y reference $5014R_1$ is substantially in the same known location, with respect to its locating reference, for each apparatus similar to apparatus 5010. This is similar for the X constraint 5014DX.

Figure 13B:
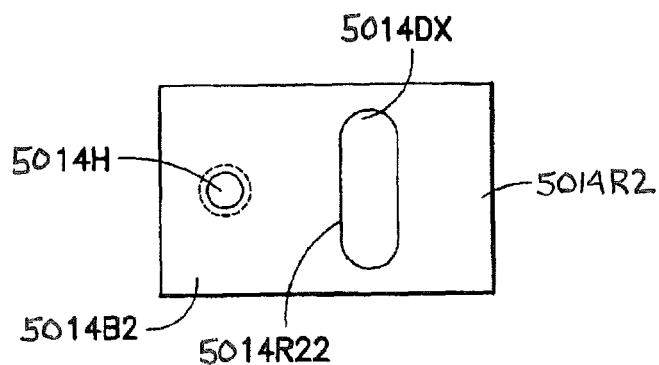
FIG. 13B is an elevation view of an alignment datum on the processing tool in FIG. 13A that is part of an alignment system for alignment of the movable portion to the processing apparatus.

As seen in FIG. 13A, in this exemplary embodiment the Y and X reference datums $5014R_1$, $5014R_2$ (and the Y and X position constraints defined thereby) are formed by plates 5014B1, 5014B2. Plates 5014B1, 5014B2 may be generally similar. Plate 5014B1 that forms the Y reference datum 5014R1 has a front face 5014F1 that is substantially flat, which may be formed by machining or other suitable process. In this exemplary embodiment it is the front flat face 5014F1 of plate 5014B1 that defines the Y constraint 5014DY. The plate 5014B1 is located (as described above) so that its front face 5014F1 is at the known location and is mounted to front face 5014F by any suitable means, such as mechanical fastening, brazing, welding or bonding, that maintain the front face in the known location. When mounted, the front face is substantially perpendicular to the horizontal (X-Y) or support plane defined by the support surface G (e.g. FAB floor, see FIG. 14) supporting the apparatus 5010. FIG. 13B shows an example of plate 5014B2 forming X reference datum 5014R2. Plate 5014B2 may have an elongated slot 5014R22 formed therein as shown in FIG. 13B. The elongated slot defines the X constraint 5014DX as will be seen below. Plate 5014DX is located so that slot 5014R22 is located at the known distance and may be mounted to the front face 5014F of the apparatus in a manner similar to plate 5014B1. When mounted, the slot 5014R22 is substantially parallel to the normal of the plane of the support surface G. Each plate 5014B1, 5014B2 has a fastening hole 5014H for receiving a mating fastener (see FIG. 15) on the movable section 5018. In alternate embodiments, the Y and X reference datums may be formed by any other desired means such as different structural members, by electronic or by electro-optical means.

Figure 14:
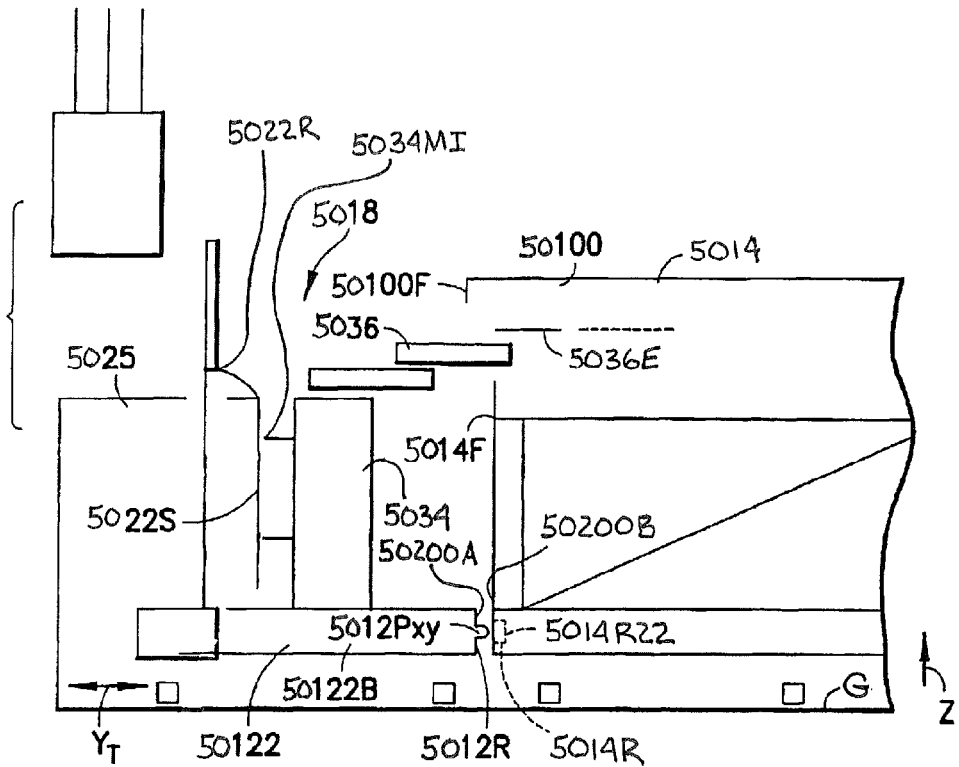
FIG. 14 is a schematic elevation view of the processing tool and movable portion of the apparatus in another removed position that is proximate to the installed position of the movable portion in the apparatus.
Figure 15:
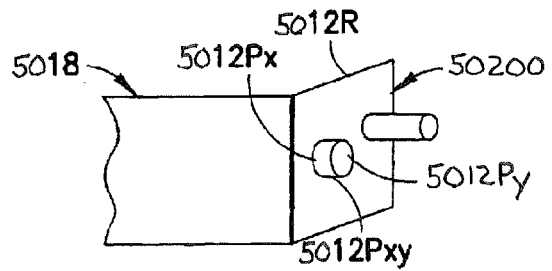
FIG. 15 is a schematic partial perspective view of a section of the movable portion in FIG. 12 showing another portion of an alignment system for aligning and mounting the movable portion of the processing apparatus.

Referring again to FIG. 14 and as noted before, movable section 5018 has conjugal mounting interface portion 50200A of positioning system 50200. As seen in FIG. 14, in this exemplary embodiment the interface portion 50200A is positioned on the rear face of the movable section, in a position that reflects the arrangement and positioning of mating interface portion 50200B on the front face 5014F of the rear section 5014 (see FIG. 13A). Mounting interface portion 50200A includes positioning feature 5012R, arranged as will be described in greater detail below, to conjugally interface or operate with the position constraint features 5014DY, 5014DX of the mating interface portion 50200B. Mounting interface portion 50200A may generally also include mechanical and other interface couplings (e.g. power communication systems) for operably connecting the movable section 5018 to the tool when in the installed position. FIG. 15 is a partial view of the movable section showing the positioning feature 5012R of the mounting interface portion 50200A of the movable section 5018 in this exemplary embodiment. As seen in FIG. 15 the position feature 5012R in this embodiment is formed by pins or posts 5012PXY. The positioning feature 5012R has two pins 5012Pxy corresponding to the Y and X reference datums 5014R1, 5014R2 of mating interface portion 50200B (see FIG. 13A). The pins 5012Pxy are substantially similar. One pin 5012Pxy is shown in FIG. 15 for example purposes. As seen in FIG. 15, the pins 5012Pxy depend from the frame 50122 of the movable section 5018. Attachment of the pins 5012Pxy to the frame may be by any suitable means. The location of pins 5012Pxy on the frame 50122, shown in FIG. 15 as being somewhere on the base 50122B of the frame 50122, is loosely controlled. Accordingly, there may be substantial variance in the location of the locating pins, similar to pins 5012Pxy, on the frames of different movable sections similar to movable section 5018. Hence, as may be realized the frame 50122 and other structure (with the exception of the automation component mounting interfaces 5022SM, 5022TM on component mounting structures 5022S, 5022T) of the movable section 5018 is not repeatably located relative to the apparatus 5010. However, as will be seen below the features of the exemplary embodiment provide a repeatable location of the automation components 5034, 5038, 5025, and hence the automation engine formed thereby, relative to the apparatus 5010 with substantially no variation in location between different movable sections similar to section 5018. Pins 5012Pxy may be made of any suitable material such as metal, plastic or ceramic. As seen in FIG. 15, pin 5012Pxy may have a generally cylindrical shank portion 5012Px terminating in a rounded end 5012Py. The cylindrical portion 5012Px may be sized to be received into the slot 5014R22 of plate 5014B2 forming the X constraint 5014DX on the rear section 5014 (see FIG. 13B). The cylindrical portion 5012Px may form a close sliding fit with the slot 5014R22. This allows the cylindrical portion 5012Px of the pin to slide along the slot length, which as noted before is oriented in the Z direction (i.e. in the direction normal to the apparatus support plane G, see FIG. 14). As may be realized, engagement between the cylindrical portion 5012Px of the pin 5012Pxy and slot 5014R22 of the apparatus position reference 5014R2, establishes the location along the X axis. If desired, a tapered shank portion (not shown) may be provided between cylindrical portion 5012Px and the end 5012Py of the pin to ease insertion of the pin into slot 5014R22. The rounded end 5012Py of the pin 5012Pxy contacts the flat surface 5014F1 (see FIG. 13A) of plate 5014B1 forming the Y reference 5014R1 and Y constraint 5014DY, when movable section 5018 is in the installed position. The rounded end 5012PY of the pin 5012Pxy provides substantial point contact against the flat surface 5014F1 of the plate to establish the location along the Y axis. The rounded end 5012Py is unrestrained and can slide along the flat surface 5014F1 in the Z and X directions to satisfy the X constraint and other alignment constraints. In alternate embodiments, the positioning features 5012R may be provided by any other desired structural, mechanical or electrical means that operate in conjunction with the reference datum of the mounting interface of the rear section for positioning.

As noted before, the automation components (e.g. transport apparatus 5034, aligner 5038, load ports 5025, traverser (not shown)) are mounted on the movable section 5018 to provide a repeatable location on each movable section similar to section 5018. Before attachment of the respective automation component to the corresponding automation component mounting structure 5022S, 5022T, 5022R, the automation component is located in relation to a locating reference independent of the dimensional variances of the structure of the movable section 5018 or of the apparatus 5010. In this embodiment, the automation components may be positioned and aligned with respect to the support surface G (see FIG. 14) and the X,Y locating features provided by the positioning feature 5012R of the movable section mounting interface portion 50200A. For example, the transport apparatus 5034 may be located so that the shoulder axis of rotation ZR is located at a known location relative to the X positioning pin 5012Pxy and the Y positioning pin 5012Pxy. The transport apparatus 5034 is also oriented so that the substrate holding plane provided by the end effector 5036E is substantially parallel to the plane of the support surface G. Thus, the transport apparatus 5034 is placed in a repeatable location, based on the independent positioning references, in every movable section similar to movable section 5018 with substantially no variation in transport apparatus location between different movable sections. Hence, dimensional variances in the structure of the movable section 5018 or in the apparatus 5010 do not affect positioning of the transport apparatus 5034. Similarly, the aligner 5038 may also be located so that the aligner axis of rotation (not shown) is at a known location from the X, Y, positioning feature 5012R, and the substrate holding plane is level with the support plane G. In alternate embodiments, the aligner may be leveled with respect to the substrate holding plane provided by the transport apparatus end effector 5036E. Leveling and positioning of the automation components may be accomplished using any suitable mechanical or electronic means. All other automation components may be positioned in a similar manner to that described above. In the case of the traverser, it is leveled with respect to the support plane. The load ports 5025 are leveled to the substrate holding plane of the end effector 5036E. Thus, each automation component (and collectively the automation engine) on the movable section is in a repeatable location relative to the desired independent references of the apparatus 5010 (e.g. front face 50100F and centerline of load lock 50100) and the support planes with no substantial variance between different movable sections.

With the respective automation components positioned in the repeatable location, the mounting interface 5022SM, 5022TM of the automation component mounting structure may be adjusted or formed to engage/interface with the mating mounting interface 5034MI of the automation component and allow attachment of the automation component to the mounting structure of the movable section. The repeatable location of the respective component mounting interface, provided as described above, and the repeatable location of the automation component itself, also described above, result in the mounting interface 5022SM, 5022TM of the movable section mounting structure being in a known repeatable location that does not vary substantially between movable sections. The repeatable location with substantially no variance of the component mounting interface 5034MI, 5038MI, of the automation component 5034, 5038 itself and of the corresponding mounting interface 5034MI, 5038MI of the automation component 5034, 5038 itself and of the corresponding mounting interface 5022SM, 5022TM on the mounting structure, enable any desired automation component on the movable section to be immediately swapped on the movable section with an interchangeable component without readjustment in the component mounting interface, to component location, relative to either the movable section or the apparatus, or the mounting interface on the mounting structure. This is not possible with conventional devices. The repeatable location of the movable section automation engine, provided as described before, also enables the movable section 5018 to be swapped between similar processing apparatus without positional adjustment of the automation engine relative to the rear section 5014 at least in the X and Y directions.

In summary, the installation of automation components on the movable section 5018 is accomplished in the following manner. Each automation engine is provided with mounting interfaces 5034MI, 5038MI positioned in a known repeatable location (such as by using a fixture or tool). The movable section 5018 and non-movable/rear section 5014 of the apparatus 5010 are provided with an interface system 50200 having locating features 5014R, 5012R located from independent references of the apparatus 5010 (e.g. front face 50100F of load lock 50100 and centerline of load lock slot valve). At installation of each automation component is positioned with respect to the locating features, that are independent of variances in the movable section structure. Also, at installation, the transport apparatus 5034 is level to the support plane G, the traverser is level to the support plane, the aligner 5038 is level to the support plane (or end effector). The load port 5025 (in particular the pod carrier load interface) is level to the end effector. The FAB automated material handling system, that interfaces with the load port pod carrier, is level to the load port.

Figure 9:
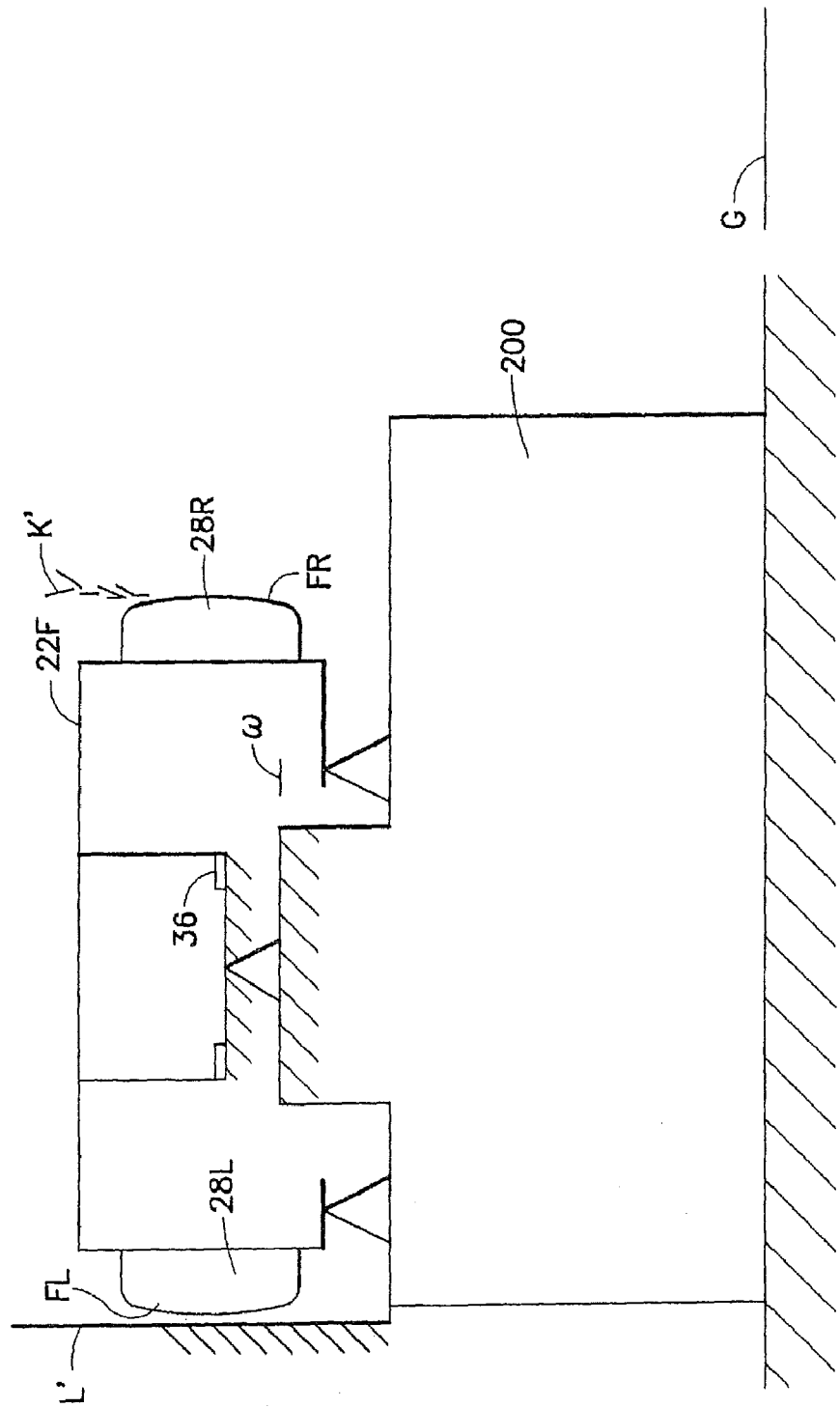
FIG. 9 is a schematic elevation view of a portion of the processing apparatus in accordance with still yet another exemplary embodiment.

Referring again to FIGS. 2 and 2A, as may be understood, each interchangeable transport chamber module is substantially similar to module 18 with respect to positioning features and mating interfaces (which are similar to those described above with respect to U.S. Pat. No. 7,607,879 and processing apparatus 5010), and hence the following description will refer to all such modules for convenience as modules 18. The position/inclination control surfaces and features FL, FR of each respective interface define a repeatable spatial position (e.g. along X, Y, Z axis, the Z-axis is out of the page in FIG. 2) and attitude (rotation about X, Y, Z axis) of the given interface 28F, 28B, 28L, 28R for each interchangeable transport chamber module. For example, each of the modules 18 may have a module reference datum, and the control surfaces/features FL, FR may be established relative to the module reference datum. The reference datum may be, for example, the workpiece transport plane W (see FIG. 2A), though any other desired reference datum common to the modules may be used. As noted before, and as will also be described further below, the transport chamber module defines multiple workpiece travel lanes A,R. In the exemplary embodiment shown in FIG. 2A, the workpiece plane W corresponds to lane A for example purposes, and in alternate embodiments the workpiece transport plane corresponding to any travel lane may be used as the reference datum of the module. The module reference datum W may be established (for each module 18) from a global reference datum G, as will also be described below. The result as may be realized, is a constancy or repeatability of position and attitude of each module reference datum W, and of the control surfaces/features FL, FR of the module interfaces. The control surface/features on each module interface may be established relative to the module reference datum using for example a reference bench or jig (see FIG. 9), with suitable datum features. The reference jig may have one or more base datum surfaces providing the basis for the module reference datum (e.g. workpiece transport planes W). The base datum surfaces (or features) may be determined from the desired global reference datum G, such as the FAB facility floor. The reference jig may also have registration datum features, such as datum surfaces, laser position registration system or optical position registration system, at a fixed predetermined position and attitude relative to the base datum surfaces of the jig. The registration datum features are used to set the control surface/features FL, FR of the interfaces 28L, 28R, 28F, 28B of each module 18. In order to set the interface control surface/features FL, FR of a given module, the module may be positioned on the reference jig so that it is in a desired position relative to the basis datum of the reference jig. The interface control surface/features FL, FR of each desired interface 28L, 28R, 28F, 28B on the module may then be placed in final positions using the registration datum features. For example, if the control feature FL, FR is a vertical planar surface(s) (such as may be used with a three (3) point contact coupling to level the module) then the surface may be adjusted (using suitable forming processes such as machining stock, or adjusting mechanical connections) so that its planarity and vertical planar orientation matches the position and attitude of the corresponding registration datum features of the reference jig. Thus, as may be realized, similar control surface(s)/feature(s) of each interface of each module 18 will have substantially the same positions and angular orientations with respect to the module reference datum, that is in turn substantially common to all modules. Moreover, by setting the position and angular orientation of workpiece interfacing components inside the module relative to the module reference datum, the result is a constancy and repeatability of component position and as noted before truly interchangeable modules. Custom positioning and alignment of modules or interior module components at module installation is thus eliminated. Also, this allows simplification of the transport robot teaching process and reduction in its teaching time. In alternate embodiments, any suitable reference datum system may be used to repeatably establish the control surface(s)/feature(s) of the module interfaces.

Figure 2A:
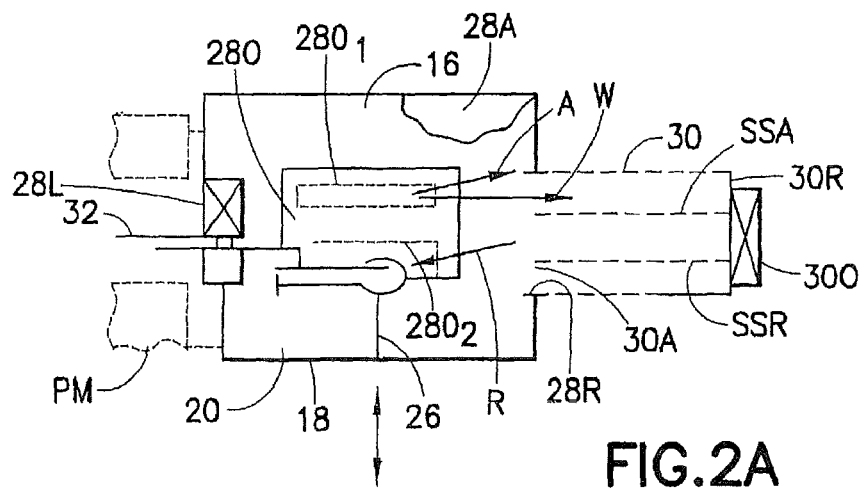
FIG. 2A is an elevation view of the transport chamber module in FIG. 2.
Figure 10:
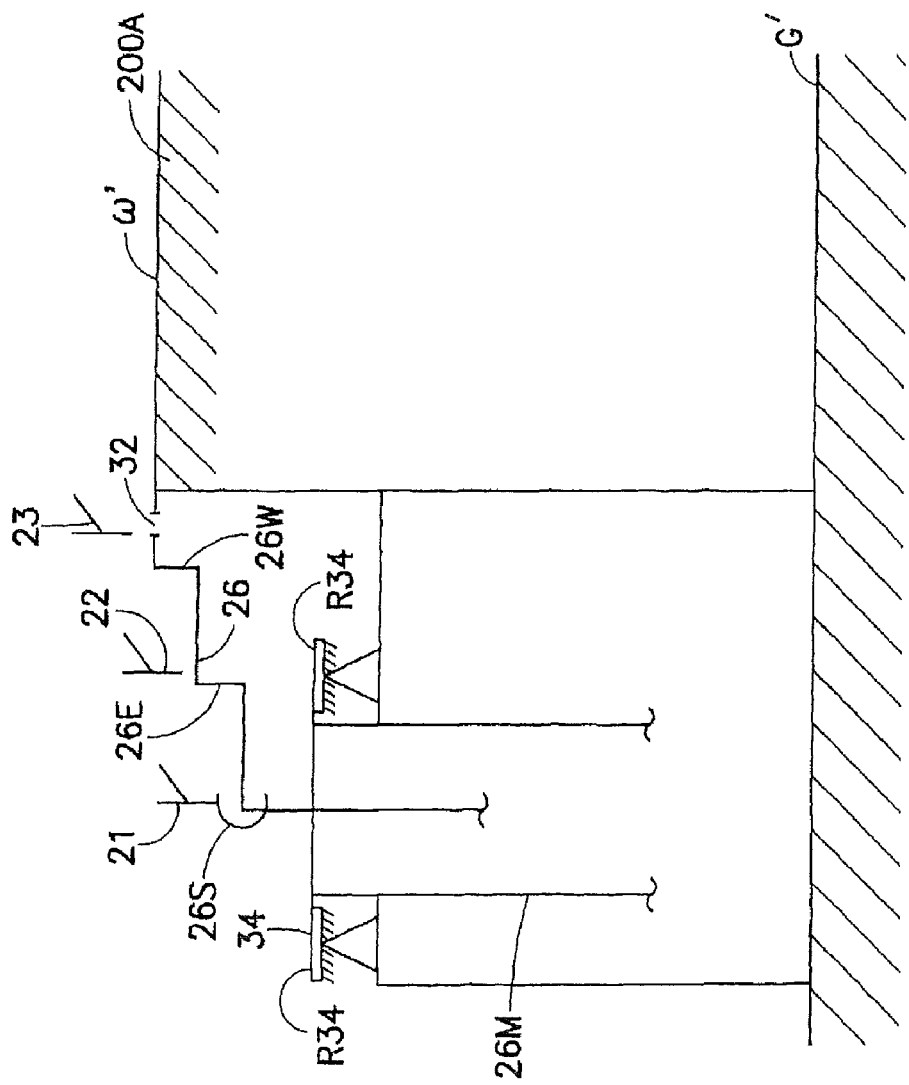
FIG. 10 is another schematic elevation view of another portion of the apparatus.
Figure 11:
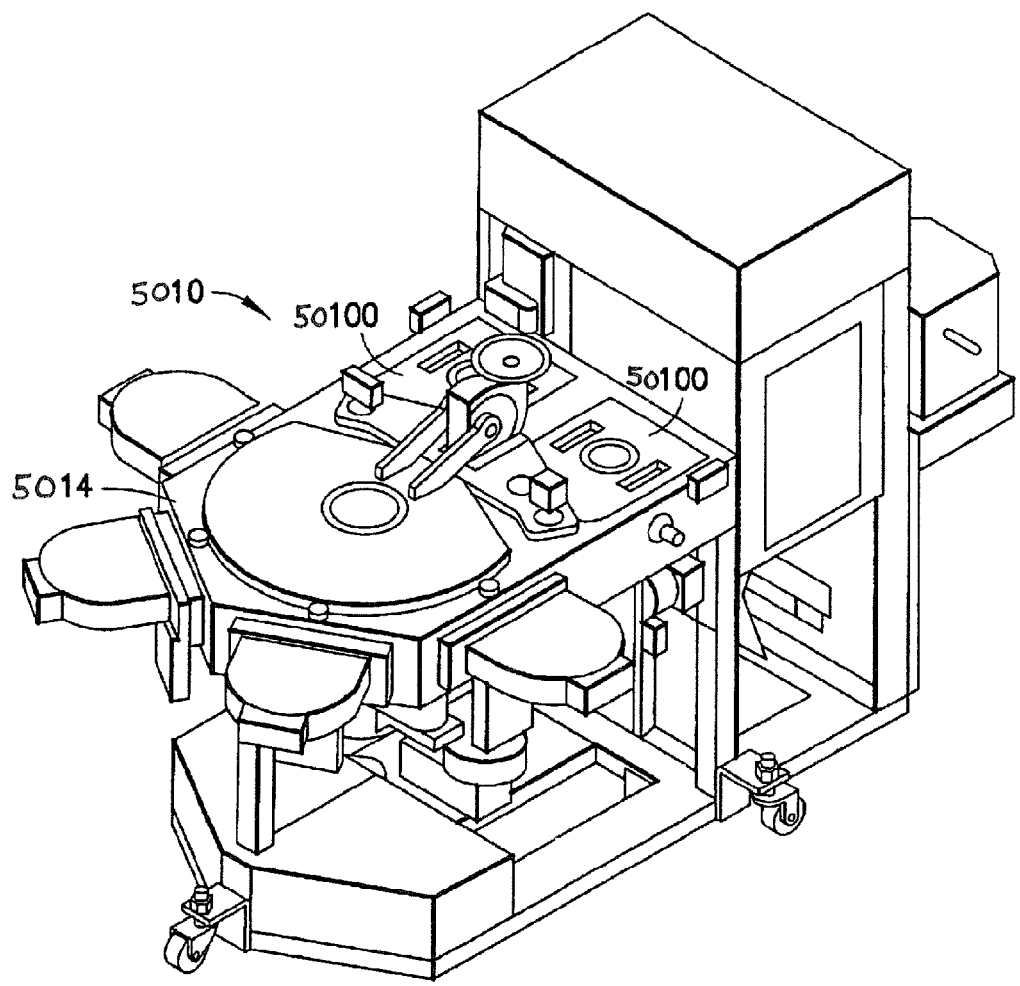
FIG. 11 is a perspective view a substrate processing apparatus.

Referring still to FIG. 2, transport chamber module 18 has an integral workpiece transport apparatus 26. The apparatus 26 may have one or more end effector(s) 32 (one is shown in FIG. 2 for example purposes) capable of holding and moving workpiece(s) S as desired (for example in the directions indicated by arrows r,θ and also in the Z (vertical/direction). In the exemplary embodiment shown, the transport apparatus is a multi-articulated link transport arm similar to robot arm 15 in the interface section 12, except as otherwise described below. In alternate embodiments, the workpiece transport apparatus in the transport chamber module may be of any other suitable configuration. The transport arm 26 in this exemplary embodiment, may have a drive section operably connected to the desired links of the transport arm to provide the arm with for example, three (3), four (4), five (5), six (6) or more degrees of freedom. The degrees of freedom depend on the number of independently driven links, the number of arm end effectors and whether the arm is capable of indexing or vertical (Z axis—out of the plane of FIG. 2) motion. For example, a transport arm with a single end effector, two (2) independently movable links (e.g. independent rotation about shoulder 26S and independent rotation about elbow 26E) and indexing capability (Z axis) has three (3) degrees of freedom. The transport arm and its drive section may be packaged as a module 26M for mounting to the frame 22F of the transport chamber module 18. For example, the transport arm module 26M may be a "drop-in" module that may be installed or removed as a unit, such as via access opening 24O (see FIG. 2). The transport arm module 26M may have mounts (not shown) that engage desired attachment sections (not shown) on the transport chamber module frame 22F. The transport arm module 26 may also have deterministic position control features, such as kinematic couplings that cooperate with complementing features 36 on frame 22F providing for repeatable positioning of the transport arm module 26M in the transport chamber module. This enables the transport arm module 26M in a transport chamber module to be freely interchangeable with other similar transport arm modules, and conversely allows the transport arm module to be mounted in any transport chamber module with substantially no post installation adjustment. The position control features 34 of the transport arm module and complementing features 36 of the module frame 22F are established in a repeatable position relative to the module reference datum, such as the workpiece transport plane W (see also FIG. 2A). The complementing features 36 of the transport chamber module frame 22F may be set using a reference jig 200 (see also FIG. 9) in a similar manner to that described before for the control features FL, FR of the module exterior interfaces 28L, 28R, 28F, 28B. The control features 34 on the arm module 26M may also be established in a similar manner. For example, a reference jig 200A (see FIG. 10), of the same type as the reference jig 200 used for the module frame or of any other desired different type, may be used. The reference jig 200A may have a base reference datum W' (provided in any suitable manner) established from a global reference datum G'. The base reference datum W' and global reference datums G' in the jig 200A for the transport arm module 26M are the same as the base reference W' and global reference datums G' of the reference jig 200 used for the chamber module frame 22F. For example, in the exemplary embodiments, the global reference datum for both jigs may be the FAB floor, and the base reference datum the representative position for what shall become the workpiece transport plane W (see FIG. 2A). Thus, the base reference datum(s) used to establish the position determination features 36, 34 respectively on the chamber module frame 22F and the arm module 26M is substantially the same or common datum. The reference jig for the transport arm module 26M also has registration datum features R34 used to set the control features 34 on the arm module 26M. The transport arm module 26M may be positioned on the reference jig 200A (see FIG. 10) so that a desired portion of the end effector 32 (see also FIG. 2), such as the workpiece support surface (not shown) is aligned with the base reference datum W' (which as noted before corresponds in this embodiment to the workpiece transport plane W). In the exemplary embodiment, when the module is on the reference jig the pivot axis $Z_1, Z_2, Z_3$, of the pivot links (e.g. axis $Z_1$ at shoulder 26S, axis $Z_2$ at elbow 26E, axis $Z_3$ at wrist 26W, see FIG. 10) may be set to ensure that the end effector 32 (i.e. its workpiece support surface/plane) remains aligned with the base reference datum W' during r,θ motion (see FIG. 2) of the arm 26. The control features 34 on the arm module 26M are defined with any suitable forming or adjusting process to match the position of the registration datum features R34 on the jig 200A. The result, as may be realized, is that the control features 34 of each arm module 26M are in a repeatable position. The deterministic positioning configuration and repeatable position of the cooperative control features 36, 34 respectively on the chamber frame 22F and arm module 26M allow not only for rapid installation with accurate positioning of the arm module 26M in the chamber module 18 substantially without in place adjustment of the arm 26. That also facilitates the interchangeability of arm modules 26M in chamber modules 18, but further allows interchangeability of the arm module 26M with any other component module capable of being mounted inside the chamber module 18 (e.g. an aligner component module, or any other desired workpiece station, buffer module, metrology module, chamber) having position control features similar to control features 34 of the arm module. Thus, chamber module 18 is reconfigurable, capable of being turned for example from a transporter module, to an aligner module, metrology module or any other station module merely by swapping out the interior component modules. As noted before, each interface 28L, 28R, 28F, 28B of the transport chamber module 18 has an opening 28O therein through which workpieces may be transported in and out of the module. FIG. 2A is a partial cross-sectional view of a representative module 18 in which interface 28L, 28R, 28B of the module are seen. In this embodiment, the interfaces 28L, 28R, 28B, 28F are similar, through in alternate embodiments different interfaces may be provided on different sides of the module. The opening in each interface is sized to allow workpieces to be transported through the opening, by transport apparatus, along multiple different and separate travel lanes A, R. In the exemplary embodiment shown, the interface opening 28O is a single opening and can accommodate two (2) travel lanes A, R that are vertically separated from each other. In alternate embodiments, the opening may be sized to accommodate more than two different and separate travel lanes. In other alternate embodiments, the different travel lanes for transporting the workpieces may be separated in any desired direction. In yet other alternate embodiments there may be multiple separate workpiece transfer openings in the interface, such as an opening for each of the multiple travel lanes. Thus, each travel lane may extend through a dedicated transfer opening. In still yet other alternate embodiments, the opening in one or more of the interfaces may accommodate but a single travel lane. Generally, such interfaces may be located on module sides where but one process module is to be mated. The separation between the separate travel lanes A, R (see FIG. 2A) is generally sufficient to allow work pieces S, each being transported along a different travel lane by different end effectors (e.g. one workpiece being transported along lane A by one end effector and the other workpiece being transported along lane R by a different end effector), of the same or different transport apparatus, to pass one another. The openings 28O in the module interfaces may be closable in order to allow the module interior to be isolated from the atmosphere on the other side of a given interface. For example slot valves may be mounted on the module to seal the opening 28O in the interface. The slot valves may be actuated pneumatically or electrically or by any other suitable actuation system. Control of the slot valve actuation, as well as the other operable systems of the transport chamber module 18 (e.g. transport arm 26) may be provided by controller 400 (see FIG. 1). The module 18 has a communication and power interface 20, shown schematically in FIG. 2, for interfacing the operable systems of the module 18 to the controller 400, and suitable power or actuation systems (e.g. electrical, pneumatic, vacuum, thermal, etc.) as will be described further below. As may be realized, closure of the slot valves blocks the travel lanes A, R. A single slot valve may be used for both travel lanes, or each of the travel lanes A, R. may have a different and separately actuable slot valve. This arrangement may be used when multiple stacked load locks or process modules are mated to one interface as will also be described below. Unused travel lanes through the opening may be sealed off with a closure mounted to the border of the opening and sealing the portion of the opening in which the unused travel lane is disposed.

Referring still to FIGS. 2-2A, in the exemplary embodiment the transport chamber module 18 may have a workpiece station 30 integrated thereto. The workpiece station may be for example an aligner, a buffer, a metrology station, a heating station, a load lock or any other desired station or station combination. The workpiece station may be configured as a sub-module 30M capable of being mounted and removed as a modular unit to the transport chamber module frame 22F. In the exemplary embodiment shown, the workpiece station module 30M is mated to one of the mating interfaces 28R (FIGS. 2-2A show the module 30M at interface 28R and in alternate embodiments the workpiece station module may be located at any interface). As may be realized, the workpiece station module 30M may be provided with repeatable and position deterministic features (similar to features FL, FR on interfaces 28L, 28R, 28F, 28B of frame 22F described before) to cooperate with features FR on the corresponding interface 28R to locate and align workpiece support surfaces SSA, SSR, within the workpiece station module in the desired position relative to the workpiece transport plane W. This also allows true interchangeability of workpiece station modules substantially without positional adjustments after mounting similar to transport arm module 26M described before. It also facilitates installation of the transport chamber module 18 and station module 30M to the tool 10 as a combined unit 18S. In the embodiment shown in FIG. 2A, the workpiece station 30 is a buffer station. The buffer station in this embodiment has two support shelves/surfaces SSA, SSR, one to correspond to each travel lane through the chamber 18. In alternate embodiments, the buffer station may have more or fewer support shelves. In other alternate embodiments the workpiece station module may be mounted in any other position on the transport chamber module frame and may communicate with the chamber through a dedicated opening different from the workpiece transfer openings in the chamber module interfaces. In other alternate embodiments, the workpiece station may be mounted in any other position on the transport chamber module frame and may communicate with the chamber through a dedicated opening different from the workpiece transfer openings in the chamber module interfaces. In other alternate embodiments, the workpiece station structure may be integrated into the frame of the transport chamber module, and may not be removable as a module. In the exemplary embodiment, control and power systems (not shown) of the workpiece station 30 are interfaced, via a suitable coupling to control and power distribution systems (not shown) of the chamber module 18 that in turn are connected to the tool controller and power supplies. Thus, control communication signals, and power may be directed to the appropriate systems of the workpiece stationed through the transport chamber module 18. Coupling of the workpiece station systems to the tool controller and power supply may occur automatically when the transport chamber module 18 is tied to the controller and power supply as will be described further below. In alternate embodiments, the workpiece station may be separately connected to the tool controller and power systems. As seen in FIG. 2A, the workpiece station 30 in this embodiment may have a closable opening 30A through which the workpiece station 30 communicates with the module 18. The side 30R opposite the communication access 30A (of side 30C) to the transport chamber module 18 may have another closable opening 30O. Openings 30A, 30O may be similar to each other and to opening 28O, of module 18 described before, sized for allowing multiple workpiece travel lanes (similar to but oriented at an angle to travel lanes A, R) and closable with similar gate/slot valves. Work station 30 may thus be isolated from the transport chamber module 18 (e.g. by closing access opening 30A). Correspondingly, the internal atmosphere of the work station 30 may be varied relative to the transport chamber module and vice versa. For example, the work station 30 may be provided with a vacuum or roughing pump 30V such as available from Helix Technology Corp., for evacuating the atmosphere of the work station. When the access opening 30A is closed thereby isolating the work station 30 from the module 18, the atmosphere in the work station may be pumped down independent of the modules. A controllable vent line (not shown) between module 18 and station 30 may allow controlled venting between module and station. In the exemplary embodiment, the vacuum pump 30V (see FIG. 2) may also be used to simultaneously evacuate the atmosphere of both module 18 and station 30. For example, the access/opening 20A may be open and pump 80V draws vacuum in module 18 via work station 30. Opening 30O may thus form the outer closable boundary of module 18, when station module 30M is mounted to module 18 and communicating through access opening 30A. In alternate embodiments, the transport chamber module may be provided with a vacuum pump, and the work station may not have a vacuum pump. In other alternate embodiments the station module may have more or fewer openings on any other desired module sides. In this exemplary embodiment, the station module may have a positionally deterministic, repeatable located mating interface CR1, similar to position control FR on module frame 22F described before, for repeatable mating or other modules to the station module. As may be realized, any desired module may be mated to the side 30R of the station module, such as another tool interface section module (similar to module 14, see FIG. 1) or another transport chamber module similar to module 18, or a process module.

Figure 3:
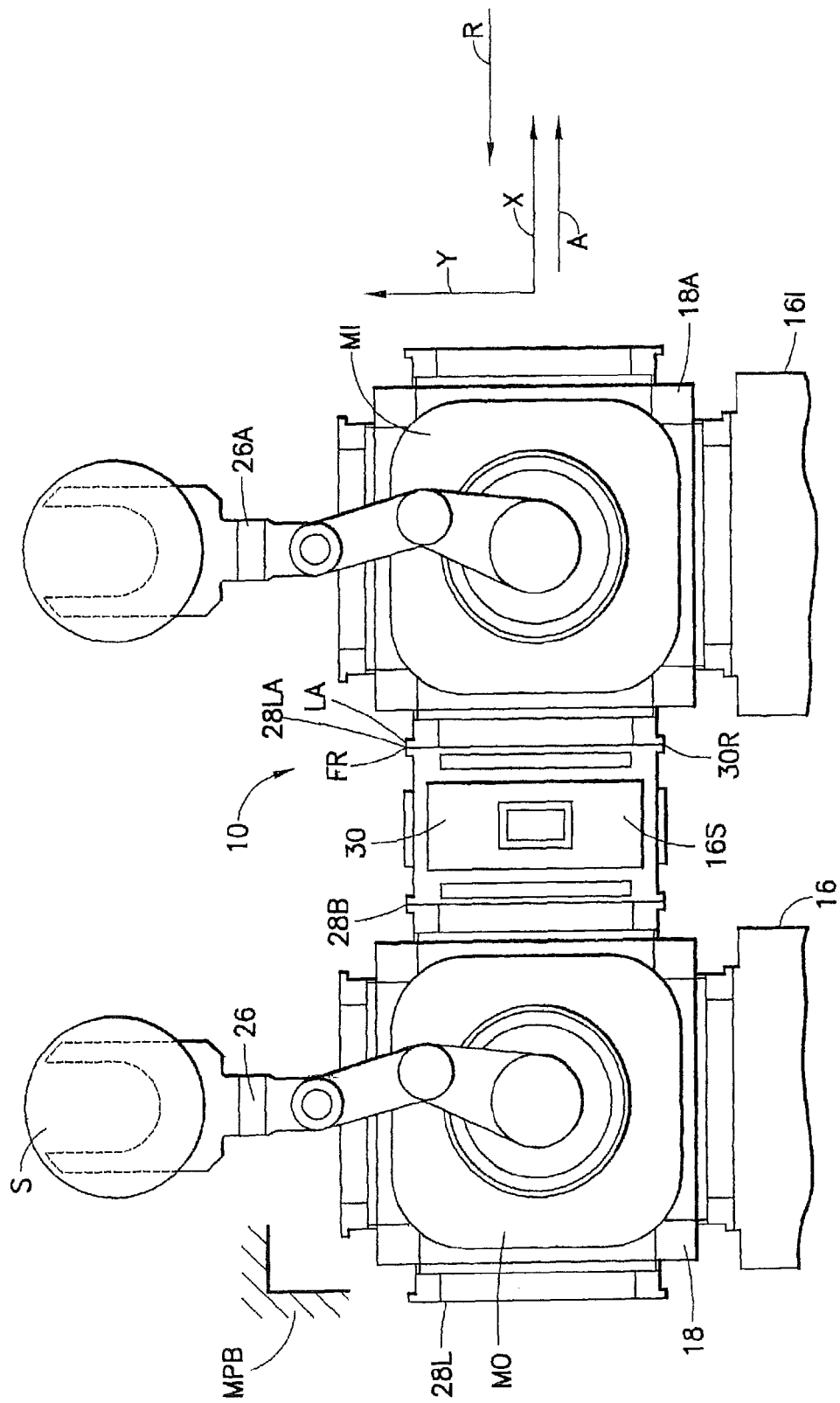
FIG. 3 is a schematic plan view of a portion of the transport chamber of the processing apparatus in FIG. 1.

The transport chamber module 18 may be joined to other similar chamber modules to form the linearly distributed transport chamber 16 of the tool. Each of the modules 18 may form a tool node linking several modules of the tool to each other structurally and operably as will be described further below. In the exemplary embodiment, the transport chamber 16, and hence, as will be described below, the tool itself is formed using a deterministic positioning approach that eliminates over constraints when mating tool modules together. For example, an initial section or module, of the tool 10, which may be a transport chamber module similar to module 18, or an interface section similar to section 12, or any other desired module or section of the tool 10, having a common reference datum (e.g. wafer transport plane W see FIG. 2A) as the other sections and modules of tool 10 may be positioned to locate the reference datum W in the desired position/orientation with respect to the global datum (in this embodiment the FAB floor). In the exemplary embodiment shown in FIG. 3, module 18 is shown as the initial module positioning of the initial module MO may be accomplished in any desired manner. For example, a support frame or other structure or device may be used to form a module position base MPB. The support frame may be similar to the automation engine support frame described and shown in U.S. patent application Ser. No. 11/154,787, filed Jun. 15, 2005 previously incorporated by reference herein. The frame may have a three point support based on the FAB floor, with adjustment capability to globally rotate the frame about axes X, Y (e.g. tilt and roll, see FIG. 3). The support frame may also have deterministic coupling features located from the global datum, which may mate with the position and inclination control features of the interfaces 28L, 28R, 28F, 28B of module 18, or with any other desired portion of the module. In alternate embodiments, the frame supports may be unadjustable, and any mounting adjustment may be provided at the supports engaging the initial module (e.g. adjustable mounts, shims, etc.). The initial module is mated to the positioning base MPB, and the reference datum W alignment relative to the global datum is verified. Misalignment may be eliminated by using the in built adjustment capability of the positioning base MPB. In the exemplary embodiment, alignment is established when the workpiece transport plane is substantially parallel to the FAB floor. With the initial module/section MO of the tool aligned in the desired orientation, other modules and sections of the tool may be joined to the initial module. The positionally deterministic and repeatably located control and positioning features at the module interfaces (described before) place the subsequent modules/sections, and internal components, in the desired repeatable orientation/locations on mating to the initial module MO. This substantially eliminates post mating adjustments to establish alignment between joined modules. FIG. 3 shows an example where another transport module 18A (similar to module 18) is mated to a side 30R of station 30 on initial module MO. Engagement of cooperating positioning and control features FR', LA respectively on the initial module MO and the added module 18A, result in the added module being set in the desired position whereby the workpiece transport planes W of the two modules are substantially aligned upon initial installation. Accordingly, the travel lanes A, R, established by the transport arm 26 in each module, and aligned with the reference plane W as described before, may be joined together in effect forming continuous travel lanes A, R through the mated chamber modules 18, 18A. Thus, workpiece(s) may be transported along the travel lanes A, R as will be described further below from one module to another through the transport chamber. The serially joined modules 18, 18A, shown in FIG. 3, in the exemplary embodiment may together form linearly extended transport chamber 16 with the X axis being the chamber's longitudinal axis, and workpiece travel lanes (similar to lanes A, R in FIG. 2A) extending longitudinally in the chamber. Extension of the transport chamber may continue as desired by further mating modules to any of the free/unoccupied sides of the chamber in a similar manner to that described for mating of module 18A to the initial module. The cooperative positioning and control features (similar to features L, R shown in FIG. 2) at the mating interfaces of the modules being mated establish positional constancy between modules as described before. Workpiece travel lanes A, R may thus be extended throughout the modules of the transport chamber 16.

Transport module 18A is shown being added to side 30R of the initial module MO for example purposes, and as may be realized other transport chamber modules may be mated to any desired side of the initial module. Also, modules may be mated to multiple sides of the initial module MO. Further, transport chamber modules may be mated to any one or more desired sides of other modules MI (see FIG. 3) of the transport chamber to linearly extend the transport chamber 16 to any desired length and configuration. FIG. 3 is also helpful in illustrating a transport chamber arrangement in accordance with another exemplary embodiment, wherein each module is part of different linearly extended transport chambers, for example parallel transport chambers 16, 16I having substantially parallel longitudinal axes in the direction of the Y axis shown in FIG. 3. In this case, the mating of module 18A and 18 may provide a shunt 16S between different transport chambers (represented respectively by module 18 and module 18A). The shunt allows transfer with transport arms 26, 26A of workpieces (if desired along different travel lanes similar to lanes A, R) between transport chambers. The position and control features on the respective mating interfaces of the modules 18, 18A enable ready verification of alignment of the workpiece transport planes (similar to plane W) of the transport chambers with each other. For example, if the position control features are properly engageable, then the workpiece transport planes of the different chambers are aligned with each other. The different transport chambers may be isolated from each other by slot valves, similar to slot valves in opening 30O in FIG. 2A. Also, the workpiece station of one of the transport chamber modules 18, 18A may be configured as a load lock (i.e. provided with suitable systems to cycle between different atmospheres such as inert gas, vacuum, etc). This allows different atmospheres to be maintained in the different transport chambers. In alternate embodiments, the transport chambers may be vertically stacked or vertically offset with one chamber crossing over the other. The vertically offset transport chambers may be joined to each other by a passage, such as a vertical passage allowing a workpiece to be shuttled in between chambers. For example, the transport arm may be provided with sufficient Z axis travel to allow workpiece transport from one transport chamber to another.

Referring again to FIG. 1, the tool interface section 12 (described before) is shown mated to transport chamber module 18. In this exemplary embodiment, transport chamber module 18 has been described for example purposes only, as forming an initial or base module MO of the tool. Hence, in this embodiment, the interface section 12 may be mated to the base module MO of the tool transport chamber 18. In alternate embodiments the interface section may be mated to any desired transport chamber module of the tool. One or more of the interface section(s) 12, 12' may be mated to different transport chamber modules along the length of the transport chamber 16 (see also FIG. 5). The interface section may have position and inclination control features, similar to features $F_L$, $F_R$ of the transport chamber module 18 described before that may cooperate with mating control features $F_L$, $F_R$ on the module 18 to place at least the automation engine portion of the interface section in the desired position and orientation relative to the transport chamber module 18 and hence to the whole transport chamber 16, when the interface section and module are joined. Accordingly, the workpiece transport planes (similar to plane W in FIG. 2) of the tool interface section 12 and the transport chamber 16 (i.e. the modules forming the transport chamber) are substantially aligned with each other on joining the interface section and transport chamber module to each other. Thus, one or more of the workpiece travel lanes may extend from the transport chamber 16 to the tool interface section. In alternate embodiments, the workpiece transport plane of the transport arm 15 of the interface section may be aligned with but offset (e.g. vertically offset) from the travel lanes A, R in the transport chamber 16. As noted before, the arrangement shown in FIG. 1 is merely exemplary. The tool interface section 12 may be mated to any desired interface 28L, 28R, 28F, 28B of the transport chamber module 18. Thus, the tool interface section 12 may be positioned in general alignment with the longitudinal axis X of the linear chamber 16, or may be mated to the transport chamber in a position offset from the longitudinal chamber axis X. For example, in the embodiment shown in FIG. 1, the tool interface section 12 may be joined to an end 16E of the transport chamber 16, or at least an end of a portion of the transport chamber (i.e. module 18 in FIG. 1 may be an end module) and the longitudinal axis X of the chamber 16 (though a single transport chamber module 18 is shown in FIG. 1, additional transport chamber modules may be added to module 18 to extend the transport chamber linearly, as shown in phantom, in the direction indicated by axis X) extends through the tool interface section 12. In alternate embodiments, the interface section or its cassette support(s) CS may be generally facing in but offset (e.g. horizontally) from the longitudinal axis X of the transport chamber.

Figure 6:
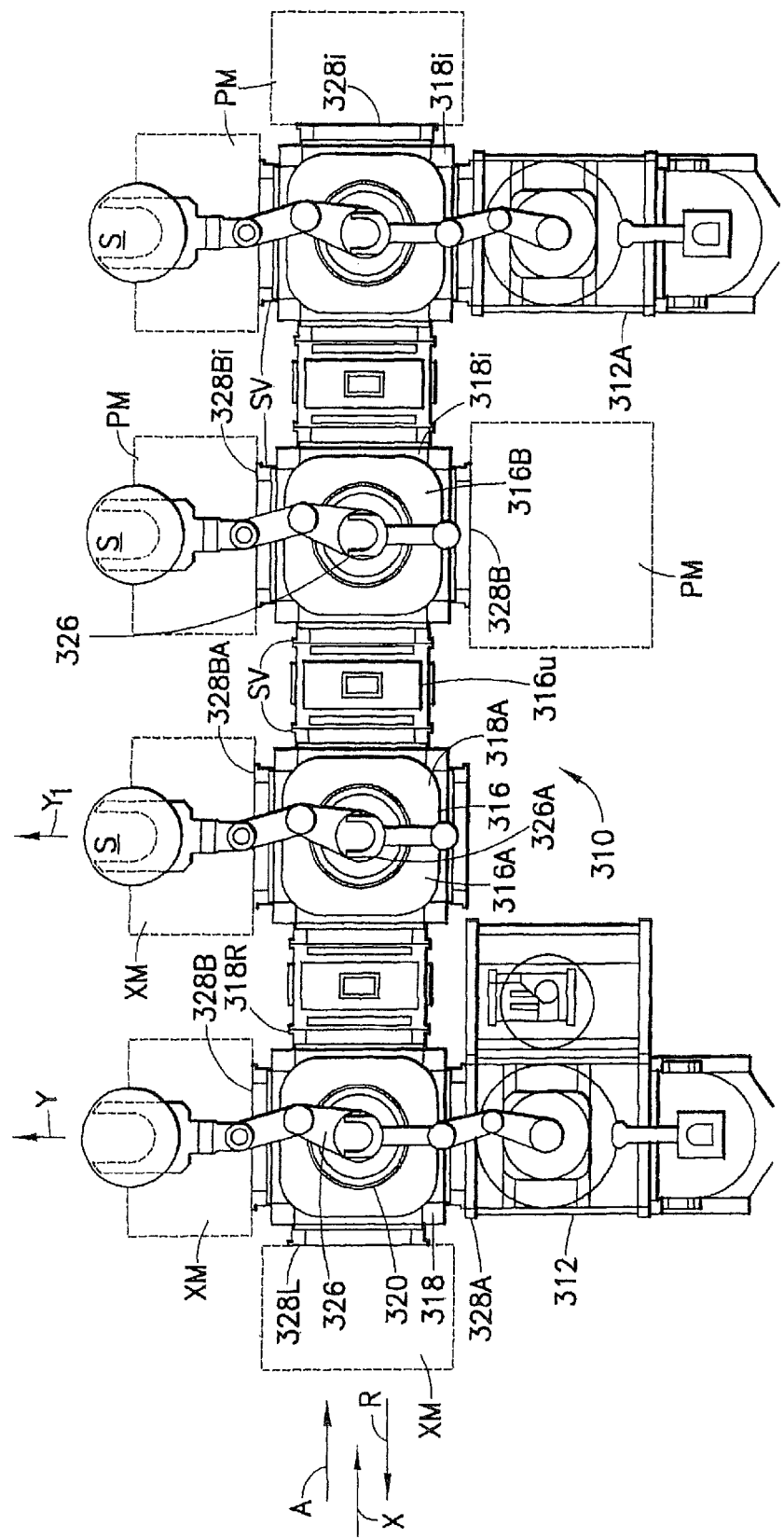
FIG. 6 is a another schematic plan view of the processing apparatus in accordance with another exemplary embodiment.

Referring now to FIG. 6, there is shown a schematic plan view of a workpiece processing system 310, that is similar to system 10, and where the tool interface section 312 (substantially similar to section 12) is mounted to a transport chamber module 318 (substantially similar to module 18) so that the interface section 312 is facing generally towards (e.g. inwards) but is offset from the longitudinal axis X of the transport chamber 316. As may be realized, in the exemplary embodiment illustrated in FIG. 6, the transport chamber 316 may be extended by attaching other transport chamber modules 318A, 318I to interfaces 328R, 328C (i.e. interfaces of the transport chamber module facing in a direction angled relative to the interfaces 328F to which the tool interface section 312 is mated. In the embodiment shown, transport chamber module 318A is connected to interface 328R of the module 318 for example purposes (and modules 318I are connected serially in a similar manner). Another module XM (shown in phantom in FIG. 6) may be connected to interface 328L, in this embodiment generally opposite module 318A at interface 328R of module 318. Module XM may be another transport chamber module, similar to module 318, or a workpiece transfer station or load lock module joined if desired to module 318 to continue extension of the transport chamber along axis X. In this embodiment, the transport chamber 316 may be transverse to the tool interface section 312 and extending on both sides of the interface section 312. In alternate embodiments the module XM at interface 328L of the transport chamber module 318 may be a processing module (such as metrology, dielectric deposition, etching, lithography, etc. and not a transport chamber module). In the exemplary embodiment shown in FIG. 6, module 318 may have still another module XM (shown in phantom) mated to interface 328B, substantially opposite the tool interface section 312. Like module XM at interface 328L, the module XM at the interface 328B may be a transport chamber module (e.g. similar to module 318, or a transfer, buffer station or load lock module) joined to module 318 if desired to extend the linearly elongated transport chamber 316 in the direction of axis Y (see FIG. 6). Thus, as may be realized, the linearly elongated transport chamber in the exemplary embodiment may be given any desired configuration. Additional transport chamber modules, similar to modules 318, XM may be joined to interfaces, similar to interfaces 328L, 328R, 328B of modules XM to continue extending the transport chamber linearly in any desired direction. In the exemplary embodiment shown in FIG. 6, module 318A may have a module XM, connected to module interface 328BA. Module XM1, which is shown in phantom in FIG. 6, may be a transport chamber module similar to module XM (e.g. a module similar to transport chamber module 318 or a workpiece transfer station, a buffer station or loadlock module allowing passage of workpieces therethrough). In this embodiment, the transport chamber may be extended if desired along axis Y1 (see FIG. 6). In alternate embodiments, module(s) XM, XM1 may be workpiece processing modules) (e.g. metrology, material deposition, lithography, etching, etc.) rather than transport chamber modules. As may be realized, in the exemplary embodiment shown in FIG. 6, the distributed workpiece transport system 320 (formed by transport arms 326, 326A, 326I that are similar to transport arm 26 (see also FIG. 2) of the linear transport chamber 316 is capable of transporting workpieces, along longitudinal axis X, Y, Y1 throughout the length of the linear transport chamber 316 as will be described below. As will also be described in greater detail below, the transport system 320 may be capable of transporting workpieces through the transport chamber along multiple independent travel lanes allowing workpieces to move in different directions, and pass one another, throughout the linearly elongated transport chamber.

Further, the transport system 320 may transport workpieces into/out of the processing modules PM arrayed along the sides of the elongated transport chamber 316. In the exemplary embodiment shown in FIG. 6, processing modules PM are connected to interfaces 328Bi, 328Fi, 328Ri of transport chamber modules 318i. The transport arms 326I mounted in the transport chamber modules 318I are capable of transporting workpieces S into and out of the corresponding processing modules as shown. The processing modules PM may be of any desired type (e.g. epitaxial silicon, material deposition, ion implantation, lithography, etching, rapid thermal processing, polishing, etc.). The processing modules PM arrayed along the sides of the linear transport chamber may be of different types positioned in the linear processing module array in any desired order. For example, the array order may be in accordance with a desired workpiece fabrication protocol associated with a desired workpiece transport direction (e.g. in the direction indicated by arrow A in FIG. 6) through the transport chamber. As noted before, modules 318, 318A, 318I of the transport chamber may have slot valves SV (similar to slot valves for closing module opening 28O in FIG. 2A) for isolating the transport chamber module, and hence the transport chamber from the processing module(s) PM adjoined thereto. Also, slot valves SV may isolate modules 328, 328A, 328I or portions of the transport chamber from each other so that the isolated modules/portions may hold different atmospheres. A portion of the transport chamber 316A may have an atmosphere such as an inert gas ($N_2$) or high purity air for example corresponding to the atmosphere of processing modules XM1 joined to and communicating directly with that portion of the chamber, and an adjoining portion of transport chamber 316B may hold a different atmosphere, such as vacuum, that may correspond to the processing modules PM joined to and communicating with that portion of the transport chamber. In the exemplary embodiment, the transport chamber may have a loadlock 316LL (see FIG. 6) between transport chamber modules 328A, 328I with different internal atmospheres, allowing workpiece(s) to pass between the transport chamber modules without compromise of the different internal atmospheres. The loadlock 316LL may be a modular section, for example similar to station module 30M (see FIG. 2), though in alternate embodiments, the loadlock 316LL may have any other desired configuration. Slot valves SV may close transport passage openings thereby isolating the loadlock module from the transport chamber modules 318A, 318I joined to the loadlock module 316LL. The loadlock module 316LL may have suitable systems (e.g. vacuum connection, vent, etc.) for cycling the atmosphere to match atmospheres of adjoining transport chamber sections. The transport chamber may include any desired number of loadlocks similar to loadlock module 316LL.

Still referring to FIG. 6, in the exemplary embodiment the processing system 310 may have more than one entry/exit station for inserting and removing workpieces S from the processing system. In the exemplary embodiment shown in FIG. 6, one entry/exit station is provided by interface section 312 and another entry/exit station is provided by interface section 312A. In alternate embodiments there may be more entry/exit stations for inserting/removing workpieces from the processing system or the transport chamber. In the exemplary embodiment, interface section 312A is generally similar to interface sections 12, 312 described before (see also FIG. 1). In alternate embodiments, the interface section may have any other desired configuration allowing workpiece(s) to be inserted/removed from the linear transport chamber and the processing system without compromise of the isolated atmosphere inside the transport chamber. The additional interface section 312A may communicate with a material handling system (e.g. an overhead AMHS, conveyor system, ground vehicles, etc.) allowing workpieces to be loaded and unloaded from the additional interface section 312A. As noted before, tool interface section 312 may be located at an end of the transport chamber 316 (e.g. in the event modules XM connected to the transport chamber module 318 are processing modules, or if no modules XM are connected to the transport chamber module), or may be located at an intermediate position on the linear transport chamber if the transport chamber 316 extends on both sides of the interface section (e.g. at least one of modules XM is a transport chamber module). Similarly, the additional interface section 312A may be positioned at an end (e.g. an opposite to the end with interface section 312) of the transport chamber, or at an intermediate position along the transport chamber.

As may be realized, having multiple entry/exit stations on the transport chamber and the tool allows insertion of a workpiece(s) via one station and post processing removal of the workpiece(s) through a different entry/exit station that may be closer to workpiece(s) post processing than the station of entry. For example, workpiece(s) may be inserted into the transport chamber 316 (and tool 310) via interface section 312 and transported, by arms 326, 326A, 326I of transport system 320 for processing in the direction indicated by arrow A. Upon completion of desired processing the workpieces may be located closer to interface section 312A than the interface section 312 of entry. Accordingly, the workpiece(s) may be transported by distributed transport system 320 (e.g. advancement in direction indicated by arrow A, or in the event the workpiece(s) have passed the interface section 312A, return in the direction indicated by arrow R on a return lane of the multilane transport chamber as will be described in greater detail below) to the closest desired interface station 312, 312A. As may also be realized, the intermediate placement of interface sections 312, 312A allows entry of the workpiece(s) into the processing system as close as desired to the desired processing modules and bypassing undesired portions of the transport chamber/processing system. This improves throughput of the system with less WIP (compared to conventional systems) and quicker "turnaround" times (e.g. time to process single carrier lot or "hot lot").

Figure 5:
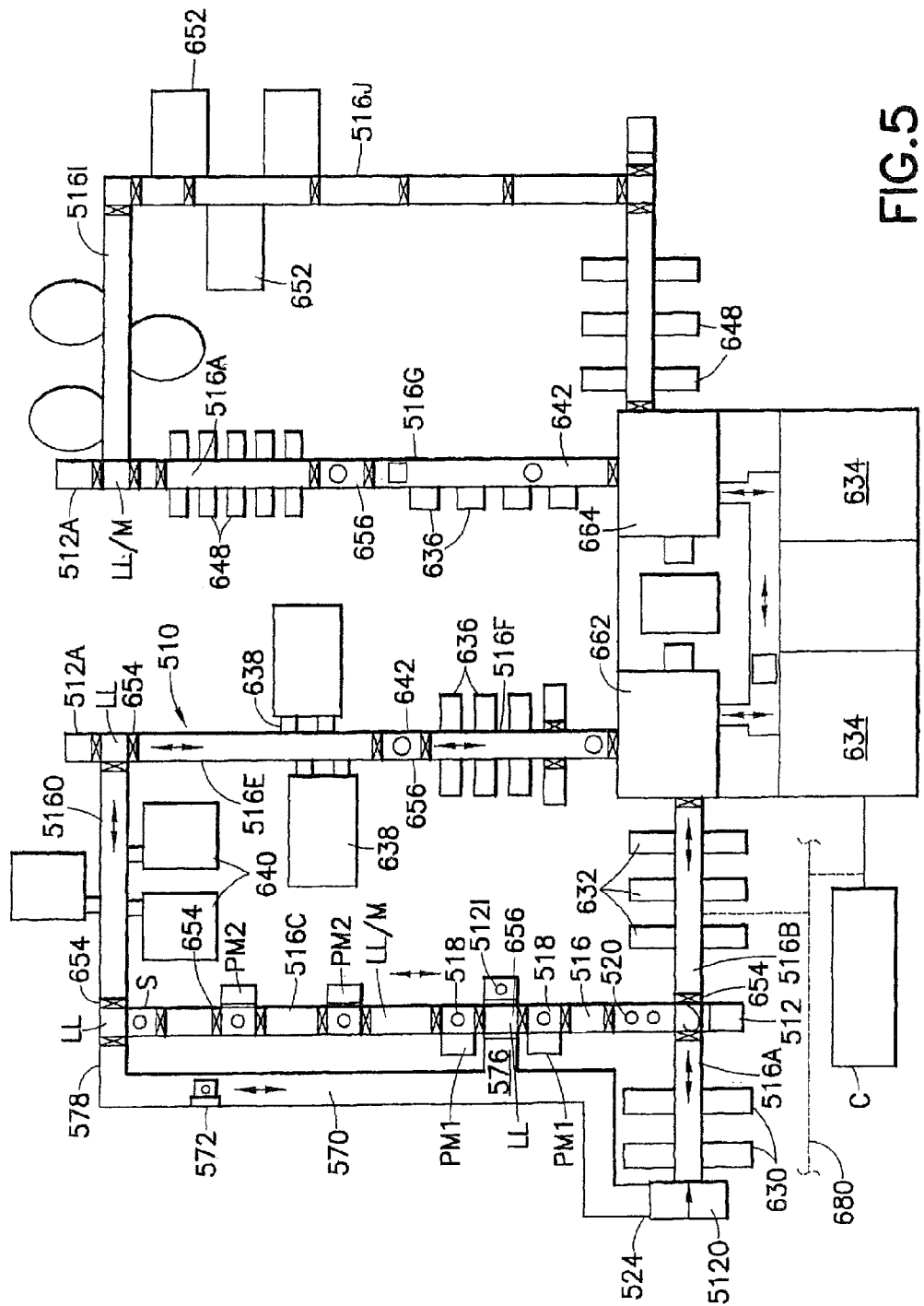
FIG. 5 is a schematic plan view of the processing apparatus in accordance with another exemplary embodiment.

Referring again to FIG. 1, as may be realized the transport chamber 16, 316 may be capable of being provided with any desired length to add any desired number of processing modules. For example, the transport chamber 16, 316 length may be established to provide an optimum number of processing modules for the handling capacity of the processing system, that will be described below, and achieve a maximum throughput for the processing system. The transport chamber may be formed to extend through a portion of the processing facility as illustrated in the exemplary embodiment shown in FIG. 5. FIG. 5 is a schematic plan view of a processing system 510 generally similar to systems 10, 310. Distributed transport system similar to transport system 20, 320 transports substrates or workpiece(s) S through process steps within the fabrication facility 510 through transport chambers 516A-516J. Transport chambers 516A-516J are formed from serially connected transport chamber modules 518 similar to modules 18 described before. Process steps may include epitaxial silicon 630, dielectric deposition 632, photolithography 634, etching 636, ion implantation 638, rapid thermal processing 640, metrology 642, dielectric deposition 644, metal deposition 648, electroplating 650, chemical mechanical polishing 652. In alternate embodiments, more or less processes may be involved or mixed; such as etch, metal deposition, heating and cooling operations in the same sequence. As will be described below, the transport system may be capable of carrying a single or multiple workpiece(s) and may have transfer capability, such as in the case where a transport arm 526 of the transport system has the capability to pick a processed workpiece and place an unprocessed wafer at the same processing or transport chamber module. Valves 654 may be sealed valves or simply conductance type valves depending upon the pressure differential or gas species difference on either side of a given valve 654. In this manner, workpieces may be transferred from one process step to the next. Examples of such pressure or species difference could be for example, clean air on one side and nitrogen on the other; or roughing pressure vacuum levels on one side and high vacuum on the other; or vacuum on one side and nitrogen on the other. Load locks 656, similar to chambers 18 in FIG. 2, may be used to transition between one environment and another; for example between vacuum and nitrogen or argon. In alternate embodiments, other pressures or species may be provided in any number of combinations. Load locks 656 may be capable of transitioning multiple workpieces on multiple workpiece travel lanes. For example, substrate(s) may be transferred into load lock 656 on shelves (not shown) or otherwise dedicated to a desired travel direction. Additional features 658 such as alignment modules, metrology modules, cleaning modules, process modules (ex: etch, deposition, polish etc. . . . ), thermal conditioning modules or otherwise, may be incorporated in lock 656 or the transport chambers. The transport chamber has multiple entry/exit stations positioned along the chamber length as desired to inert/remove wafers from the tool. In the exemplary embodiment shown in FIG. 5, the transport chamber may communicate directly with wafer or carrier stockers 662, 664, provided to store and buffer process and or test wafers. In alternate embodiments, stockers 662, 664 may not be provided, such as where the transport chamber communicates with lithography tools 634 directly.

In the exemplary embodiment shown in FIG. 5, the processing tool 510 may have an express transit passage or chamber 570. The transit passage 570 is connected at desired locations to the transport chamber 516 and also to one or more tool interfaces 512. The transit passage 570 may have a transport shuttle(s) or vehicle(s) 572 capable of traversing the length of the transit passage. The shuttle 572 may be capable of holding workpiece(s) or a workpiece carrier, and transporting the workpiece(s) or workpiece carrier through the length of the transit passage 572. The transit passage 570 may be a linearly elongated tube capable of holding an isolated atmosphere, such as $N_2$ or vacuum, or may have an atmosphere of highly clean air, that may be circulated through a desired filtration. In the exemplary embodiment shown in FIG. 5, the transit passage 572 is schematically depicted as extending along the transport chamber 516. The transit passage 570 has interconnect passages 576, 578 (two are shown for example purposes and in alternate embodiments there may be more or fewer interconnection passages) connecting the transit passage tube to the desired modules 656, 654 of the transport chamber 516. In the exemplary embodiment shown, interconnect passage 576 is joined to an intermediate loadlock (LL) module 656, and another interconnect passage 578 may be joined to another LL module 654 located at an end of the linear portion 516C of the transport chamber. In alternate embodiments, the interconnect passage(s) may be joined to any desired portion of the transport chamber 516, such as a transport chamber module 518. The interconnect passages are sized to allow passage of one or more workpieces between the transport chamber 516 and transit passage 570. A transfer system (not shown) for moving the workpieces between the transit passage and transport chamber through the interconnect passage may be provided in the transit passage or transport chamber as will be described in greater detail below. The transit passage 570 may be located in any desired position relative to linear transport chamber 516 to allow the interconnect passages to be joined to the transport chamber. For example, the transit passage may be located above, along side or under the transport chamber. The interconnect passages may be mated to any desired workpiece transit openings of the transport chamber modules, such as side openings similar to the closable openings 28O in interfaces 28L, 28R, 28F, 28B (see FIGS. 2, 2A) or top openings similar to opening 24O (see FIG. 2). The transit openings may be closed by suitable valves (similar to slot valves 654 for side openings) to isolate the transport chamber atmosphere from the transit passage. In alternate embodiments, the transit passage may have any other desired orientation, such as being angled relative to the transport chamber. In the exemplary embodiment shown in FIG. 5, the transit passage has a passage 574 that communicates tool interface section 512 to allow workpiece(s) to be loaded/unloaded from shuttle 572 from the interface section. As may be realized, the shuttle 572 is capable of substantially uninterrupted movement within transit passage 570 between for example interface section 512 and interconnect passages 576, 578, may thus transit workpiece(s) in the controlled atmosphere of the transit passage between interface section 512 and the interconnect passages 576, 578, or between passages 576, 578 thereby allowing the workpieces to bypass transport through portions of the transport chamber. The shuttle 572, which may have any desired vehicle configuration, is capable of generating higher workpiece transport speeds than distributed transport system 520. Moreover, by passing portions of the transport chamber 516, throughput of the processing tool 510 is increased and WIP is reduced. As may be realized, turnaround time for "hot lots" is also reduced. For example, a single workpiece ("hot lot") carrier may be loaded, by a FAB AMHS (not shown), at tool interface section 512O, where the "hot lot" workpiece(s) are to be processed at processing modules PM1 and PM2, the workpiece(s) may be picked, by a suitable transfer system (such as an indexer in the interface section), from the interface section 512O and placed onto shuttle 572. The shuttle 572 may transit through passage 570 to interconnect passage 576, and the workpiece may be loaded, by another suitable transfer system (not shown) to load lock 656. Hence, the workpiece is expressed from the loading location to a portion of the tool 510 proximate to the desired processing steps. The LL 656 may be cycled to allow the transport system 520 access to the workpiece. The workpiece may be moved through the transport chamber 516C by transport system 520 and loaded and unloaded from the desired processing modules PM1, PM2 for processing. Upon completion of the desired processing steps, the workpiece may be located, for example, near the LL to which interconnect passage 578 is connected. Accordingly, the workpiece may be transported, by transport system 520, to this LL for loading unto shuttle 572. The LL may be cycled to facilitate access for loading the processed workpiece onto the shuttle 572 in the transit passage without compromise of the different atmosphere in the transport chamber 516C. The shuttle 572 may express the processed workpiece to a desired location, such as tool interface section 512O (via passage 574) or interface section 512I (via passage 576) for loadout. In alternate embodiments, the express transit passage may have any desired length and configuration, and may communicate to allow workpiece transfer with any desired portion of the processing tool 510 including for example metrology, workpiece stocker (WS) or carrier stocker (CS) sections, lithography sections 634, etc.

Figure 4:
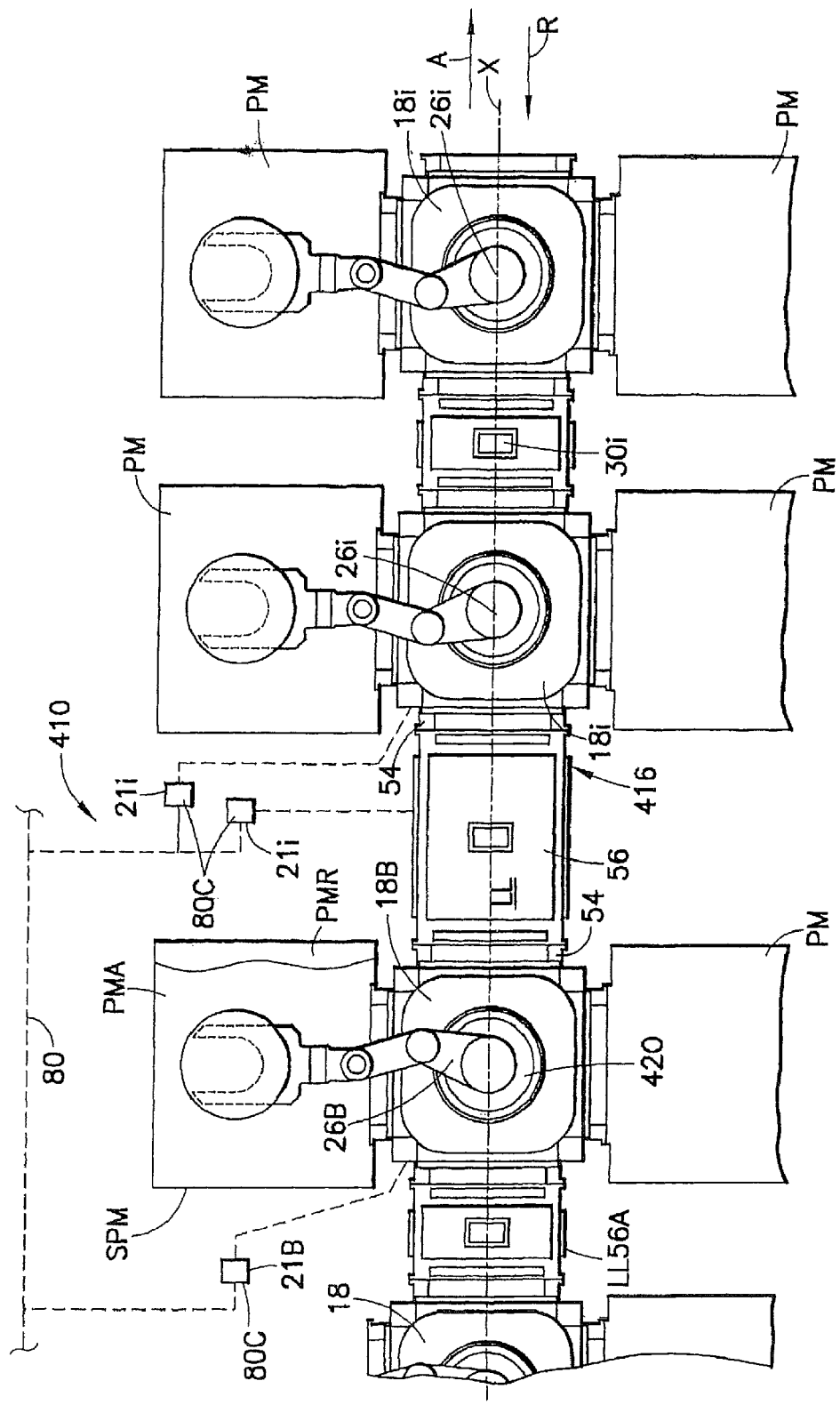
FIG. 4 is another schematic plan view of the transport chamber of the processing apparatus in accordance with another exemplary embodiment.

Referring now to FIG. 4, there is shown a schematic plan view of a representative portion 410 of a processing system/ tool such as a portion of processing system/tool 10, 310, 510 described before. The representative portion 400 of the tool, referred to hereafter as tool 410, is thus similar to tool 10, 310, 510 described before and similar features are similarly numbered. Tool 410 may have a linear transport chamber 416 extending along axis X. The chamber 416 may be formed by serially connecting chamber modules 18B, 18i (similar to previously described transport chamber modules 18, 18A) in a manner as described before for transport chambers 16, 316. Workpiece transport system 420 (similar to transport systems 20, 320, 520) formed by transport arms 26B, 26i, pivotally mounted in corresponding chamber modules 18B, 18i, is linearly distributed through the transport chamber. The transport chamber 416 may be connected to a tool interface section (not shown) in a manner similar to interface section 12 shown in FIG. 1, or interface sections 312, 312A shown in FIG. 6 to provide the transport chamber with one or more workpiece entry/exit stations as previously described. In the exemplary embodiment shown in FIG. 4, workpiece stations 30B, 30i (similar to workpiece station 30 also described before) are interstitially located between transport chamber modules 18B, 18i. The tool 410 in this exemplary embodiment also includes a load lock module 56 that enables the transport chamber modules 18B, 18i on opposite sides of the load lock module 56 to have different internal atmospheres. The configuration of the load lock module shown in FIG. 4 is representative and the load lock module may have any desired configuration allowing pass through of workpieces between adjoining transport chamber modules using the corresponding transport arms of the respective modules. The configuration of the load lock module may be similar to the transport chamber module 18 (for example utilizing a similar frame/ casing with similar positioning control features FL, FR shown in FIG. 2 and described before) or the workpiece station 30. In this exemplary embodiment, the load lock module has no integral workpiece transport and workpiece transit of the load lock module is effected with the transport arms 26b, 26i in adjoining chamber modules. In alternate embodiments, the load lock module may have an integral transport arm/mechanism capable of moving the workpiece relative to the transport chamber. The loadlock or adjoining transport chamber modules may have slot valves 54, capable of closing the transit opening, similar to opening 28O (see FIG. 2A), to selectably isolate the loadlock from the atmospheres of the adjoining transport chamber modules. Processing modules PM, PMA, PMB may be connected to the side interfaces of the transport chamber modules 18B, 18i of the transport chamber. As seen in FIG. 4, the processing modules connected to the transport chamber form linear arrays. The processing modules connected to the transport chamber may also be arranged in vertical stacks or columns. In the exemplary embodiment shown in FIG. 4, a stack SPM of processing modules PMA, PMR, may be connected to transport chamber module 18B. In alternate embodiments, stacked processing modules may be joined to any desired side interface of any desired transport chamber module. FIG. 4B shows a schematic cross sectional view of transport chamber module 18B and the stacked processing modules PMA, PMR joined to side interface 28LB of the transport chamber module. In this embodiment, the side mounting interface 28LB of the chamber module 18B has multiple vertically offset workpiece transit openings TO to support corresponding mating of the processing modules. The side interface 28LB is shown having two vertically offset workpiece transit openings TO for example purposes, and in alternate embodiments the module interface may have more workpiece transit openings supporting mating of a commensurate number of processing modules to the given interface of the transport chamber module. As may be realized, processing modules may not be connected at some of the workpiece transit openings. Hence, in alternate embodiments for example, a processing module may be connected to one of the transit openings but not the other.

As seen in FIG. 4B, in this exemplary embodiment the transport arm 26B of the chamber module 18B has a suitable Z drive 260Z capable of indexing or moving the arm, and in particular the end effector(s) 32B, up and down in the direction indicated by arrow Z. Hence, the end effector(s) 32B, which is schematically depicted and may be capable of holding one or a batch of workpieces, may be indexed to align with transit openings TO. Transfer of workpieces between transport chamber module 18B and processing modules PMA, PMR may be effected by moving the end effector 32B (via e.g. θ, r arm articulation) in the direction indicated respectively by arrows Y2, Y1 in FIG. 4B. In the exemplary embodiment shown in FIG. 4B, the transit openings TO, and hence the workpiece transfer planes to respective processing modules PMA, PMR may be substantially aligned with corresponding workpiece travel lanes A, R in the transport chamber 416 provided by the transport system 420 as will be described below. This allows the transfer arm 26B moving a workpiece through the transport chamber module 18B along a travel lane A, R to transfer the workpiece to a processing module PMA, PMR, and vice versa (e.g. picking a workpiece from processing modules PMA, PMR for moving along a travel lane A, R) without indexing (Z movement) the end effector 32B. This results in an increase in throughput of the tool as noted before, in the exemplary embodiment, the workpiece travel lanes A, R in transport chamber 416 may be polarized, workpieces being transported along travel lane A moving in one direction, for example advancing from a desired origin point such as an entry/exit station and workpieces being transported along travel lane R moving in an opposite direction, for example returning relative to the desired origin. In the exemplary embodiment, the processing modules PM, PMA, PMR substantially aligned with respective travel lanes A, R may be configured to perform process steps corresponding to the travel direction (e.g. process direction) of aligned travel lane. Thus, in the exemplary embodiment, the process steps of modules PM, PMA, PMR may be related to the chamber travel lane A, R with which the respective process module PM, PMA, PMR are substantially aligned. By way of example, if the travel direction of lane A is advancing and the travel direction of lane R is returning (to some entry station), the process performed by modules PMA, PM (aligned substantially with lane A as shown in FIG. 4B), such as material deposition, corresponds to the process direction defined by lane A, and the process performed by module PMR, such as ion implantation, etching, etc., corresponds to the process direction defined by lane R. As may be realized, the terms "advancing", "returning" are used herein merely to help identify that direction of travel along different lanes may be different relative to each other. The travel directions along lanes A, R may be established as desired relative to the transport chamber 416. In alternate embodiments, the process of modules attached to the transport chamber may be independent of the travel lanes A, R in the chamber.

Referring still to FIG. 4, utilities such as control signals, power, vacuum, pneumatics, etc. for the components (e.g. transport chamber modules 18B, 18i, transport arms 26B, 26i, workpiece stations 30B, 30i, load lock module 56, slot valves, etc.) of the tool 410 may be provided from a utility system 80 which is schematically depicted. Referring also to FIG. 5, which shows utility system 680 that is substantially similar to utility 80 in FIG. 4, the controller C may be communicably connected to utility 80, 680. The utility may include suitable communication links for connecting the controller C with the components of the tool 410, 510. The utility 80 may have coupling 80c configured to receive communication and power interface 21B, 21i of the transport chamber module 21B, 21i connected to form the transport chamber 416. The coupling 80C and interface 21B, 21i may be provided with integral programming to automatically provide a "plug and play" capability on connection of the respective interface 21B, 21i to the corresponding coupling. For example, the coupling and interface may be respectively a USB port and connector. Mating of the interface 21B, 21i to the coupling may automatically identify to the controller C the module configuration, for example module 28B is transport chamber module, with transport arm having (M) degrees of freedom and the control parameters for the transport arm drive section motors, and control instrumentation, identification and control parameters for any other controllable system resident on module 28B, position of module with respect to a desired reference frame (e.g. sixth module of transport chamber). The information, which is downloaded automatically by controller C on mating interface 21B, 21i and coupling 80C thus may provide controller with system information and control parameters for all controllable systems of the module being controlled by controller C to enable the controller to communicate and control operation of the module's controllable systems substantially immediately on coupling. The information may also provide the controller C with the geometric parameters defining the transport "space" of the transport chamber 416, incorporating the specific transport chamber module 28B, 28I, for establishing the kinematic equations and commands controlling transport motions. For example, the downloaded information may allow the controller to establish the spatial coordinates (X, Y, Z) of various features, such as pivot axes (see FIG. 2A) of the transport arm 26B, the transfer openings 28O, TO, chamber boundaries, center of workpiece pick, place positions, etc. As may be realized, the information programmed into interface 21B, 21i may be but a portion, or an identifier, sufficient to enable the controller to look up/read the information from a memory location (not shown) of the controller where the control information may have been preprogrammed. By way of example, the controller may be programmed with lookup tables or an algorithm establishing the X,Y,Z coordinates for kinematic relevant features such as pivot axes of the transport arm 26B, 26i, the locations of workpiece transfer openings, module chamber walls for (i to M) transfer chamber modules. This is facilitated by the interchangeability and position control features of the different transport chamber modules. Upon coupling the interface 21B, 21i of a given module, an indication is provided to the controller that (m) module is being coupled to other modules of the transport chamber, and already registered by the controller, causing the controller to access (via the lookup tables/algorithm) the kinematic characteristics of the module. Similarly controller C may also be programmed with the "rough" kinematic command architecture and the fine teach protocol for controlling motion of end effectors on corresponding transport arms (similar to arm 26B) of respective (i to M) transport chamber modules. As may be realized, the interchangeability and position control features of the transport chamber modules allow the "rough" kinematic command architecture for arm control to be established by computational methods, or physically with the transport chamber module disconnected from transport chamber (e.g. at the manufacturing facility), and stored on a desired medium from which the kinematic commands are stored in the system controller C. The term "rough" is used herein merely to indicate that kinematic commands established without in place teaching of the arm control with the transport chamber module mated to the rest of the transport chamber. An indication to the controller, upon a given interface 21B, 21i coupling, that (M) module has been attached to the transport chamber, may cause the controller to access the corresponding "rough" kinematic command architecture, and if desired fine teach protocol for controlling the motions of the corresponding transport arm and hence of the distributed transport system. In alternate embodiments, the module interface 21B, 21$i$ may be programmed with any other desired information to be downloaded by the controller on coupling. Upon registering that (M) transport chamber module is coupled, the controller C may further automatically access, or automatically make available to an operator corresponding programming to initialize the respective operable systems/components and query status of the various systems (e.g. slot valves open/shut, transport encoders position, etc.). Similarly, the controller C may automatically lookup and initialize suitable test protocol to verify that the systems (hardware, software) of the added module are operating nominally and if desired actuate module systems to bring them to a "zero" position. In addition, the controller may enable display features (not shown), for example indicating to an operator the addition of the module, the present configuration of the transport chamber and tool, as well as command protocol allowing entry of operator commands, via a desired user interface, to operate the systems on the added module or modify workpiece process protocol carried out by the tool to incorporate the newly available features from the added module. For example, on registration of the coupling of the transport chamber module, the controller may add or enable features on the display (not shown) schematically representing the module and its relative position in the transport chamber with respect to other modules as well as presence and status of any module systems. Also enabled may be user selectable features such as "soft keys", for initializing test programs, or teaching programs (e.g. fine teaching programming for arm 26B) for the module systems. As may be realized, any desired user interface architecture may be employed, and in alternate embodiments more or fewer features may be enabled by the controller at coupling.

Figure 4A:
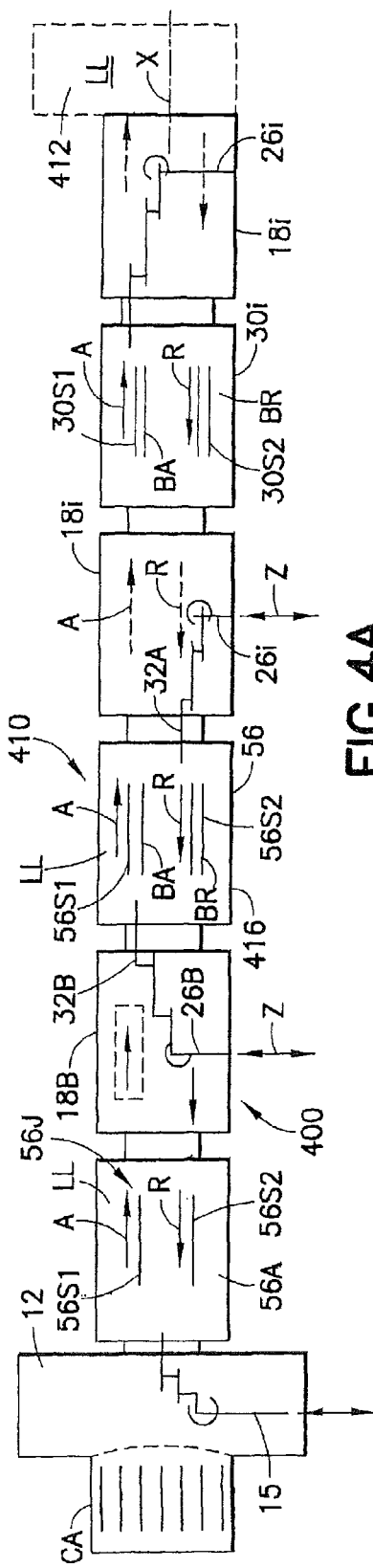
FIG. 4A is a schematic elevation view of the transport chamber in FIG. 4.
Figure 4B:
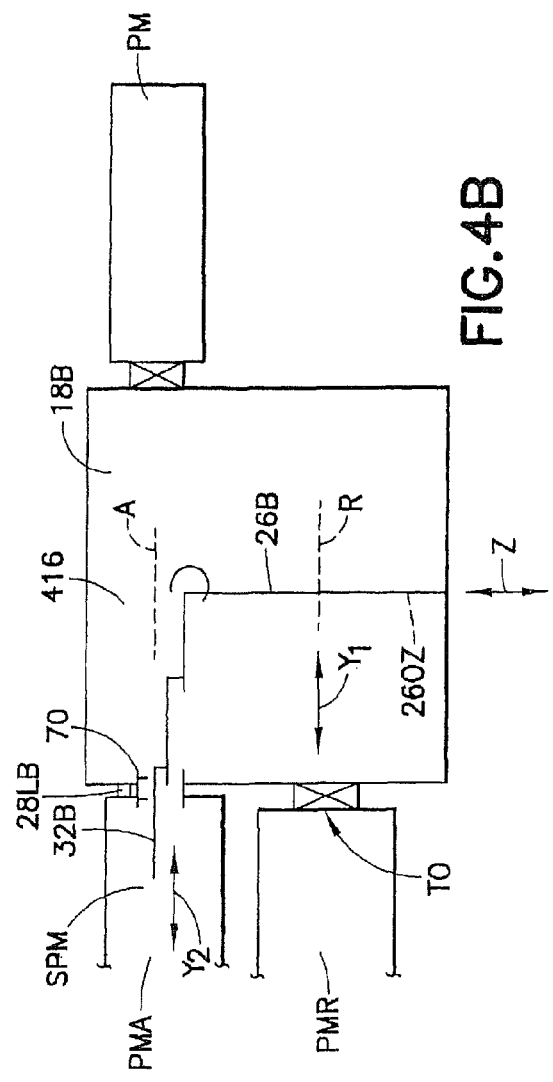
FIG. 4B is another elevation view of the transport chamber as viewed from a different direction perpendicular to the view direction in FIG. 4A.

Referring now also to FIG. 4A, there is shown a schematic elevation view of processing tool 410 such as may be taken along longitudinal axis X of the linear transport chamber 416. FIG. 4A shows tool interface section 12 representatively connected to the transport chamber 416. In this exemplary embodiment, interface section 12 may define one end of the tool transport chamber 416. As seen in FIG. 4A, the transport chamber 416 may have another workpiece entry/exit station 412 for example at an opposite end from interface station 12. Station 412 may be similar to interface section 12 (see also FIG. 1), though in alternate embodiments the entry/exit station may have any other desired configuration. In other alternate embodiments, other entry/exit stations for inserting/removing workpieces from the transport chamber may be provided. In the exemplary embodiment, interface section 12 and entry/exit station 412 may allow loading and unloading of workpieces from the tool. In alternate embodiments, workpieces may be loaded into the tool from one end and removed from the other end. As noted before, the configuration/arrangement of the transport chamber modules 18B, 18$i$, load lock modules 56A, 56B and workpiece stations forming the transport chamber 416 shown in FIG. 4A is merely exemplary, and in alternate embodiments the transport chamber may have any other desired modular arrangement. In the embodiment shown, station 412 may be a load lock. In alternate embodiments, a load lock module may be located between the end entry/exit station (similar to station 412) or the adjoining transport chamber module (similar to module 18$i$) may be configured to operate as a load lock. As also noted before, transport chamber modules 18B, 18$i$ have corresponding transport arms 26B, 26$i$ located therein. The transport arms 26B, 26$i$ of the respective transport chamber modules 18B, 18$i$ may cooperate to provide the linearly distributed workpiece transport system 420 in the transport chamber. In the exemplary embodiment, the transport arms 26B, 26$i$ of the respective chamber modules 18B, 18$i$ may be similar to each other. Accordingly, the transport arms will be described below with particular reference to arm 26B. In alternate embodiments, the transport arms/apparatus of the respective chamber modules may have different configurations. In this embodiment, the transport arm 26B may have a general scara configuration, similar to arm 26 seen best in FIG. 2. In alternate embodiments, the transport arm may have any other desired configuration, such as a "frog leg" configuration, and in other alternate embodiments any other desired transport apparatus that is positionally fixed to the transport chamber and having a displaceable end effector may be used. In the exemplary embodiment shown in FIG. 4A, the transport arm 26B may have a single forearm (similar to forearm 26F in FIG. 2) pivotally mounted to upper arm (similar to upper arm 26U in FIG. 2) and with an end effector 32B depending therefrom. The transport arm 26B may have a suitable drive section for providing the arm with three (3) (e.g. independent rotation about shoulder and elbow joints similar to joints 26S, 26E in FIG. 2, and Z axis motion) or four (4) (e.g. independent rotation about shoulder, elbow and wrist joints with Z axis motion) degrees of freedom. As seen in FIG. 4A, in this embodiment the modules 56A, 56, 30$i$ located interstitially between transfer chamber modules 18B, 18$i$ may define passive portions of the linearly distributed transport system 420 in transport chamber 416. The interstitial modules, such as load locks 56A, 56 and workpiece station 30$i$, may each have stationary workpiece supports/shelves 56S, 56S1, 56S2, 30S1, 30S2 that cooperate with the transport arms to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30$i$ with arm 261 (in module 18$i$) and between station 30$i$ and station 412 with arm 261 in module 18$i$. This process may be reversed in whole or in part to move the workpiece(s) in the opposite direction. Thus, workpieces may be moved in any direction along axis X and to any position along the transport chamber and may be loaded to and unloaded from any desired module (processing or otherwise) communicating with the transport chamber. In alternate embodiments, interstitial transport chamber modules with static workpiece supports or shelves may not be provided between transport chamber modules 18B, 18$i$. In such embodiments, transport arms of adjoining transport chamber modules may pass off workpieces directly from end effector or one transport arm to end effector of another transport arm to move the workpiece through the transport chamber.

Still referring to FIG. 4A, the transport arms 26B, 26$i$ and workpiece shelves 56S, 56S1, 56S2, 30S1, 30S2, that collectively provide the distributed transport system 420, are configured in this embodiment to allow the transport system 420 to define multiple workpiece travel lanes A, R that are separate from one another. In the exemplary embodiment, two travel lanes A, R are shown for example purposes. In alternate embodiments, there may be more or fewer travel lanes. As noted before, the workpiece transit openings (similar to opening 28O in FIG. 2A) of transport chamber modules 18B, 18$i$ and interstitial modules 56A, 56, 30i, through which the modules communicate with each other and other through which workpiece transit between modules, are sized to accommodate workpiece transit along the multiple travel lanes A, R. The transport arms 26B, 26i, in the exemplary embodiment, may be indexed to one Z position to effect movement along one travel lane A, R, and may be indexed to another Z position to effect movement along the other travel lane A, R. Similarly, in this embodiment, the static workpiece shelves 56S, 56S1, 56S2, 30S1, 30S2 in the interstitial modules may be positioned to be substantially aligned with the respective travel lanes A, R as shown in FIG. 4A. As may be realized, capacity of the workpiece shelves 56S, 56S1, 56S2, 30S1, 30S2 may be commensurate with the workpiece capacity of end effectors 32B, 32i on the as may be realized, capacity of the workpiece shelves 56S, 56S1, 56S2, 30S1, 30S2 may be commensurate with the workpiece capacity of end effectors 32B, 32i on the transport arms. Accordingly, transfer between end effectors 32B, 32i and workpiece shelves 56S, 56S1, 56S2, 30S1, 30S2 may be accomplished in a single pick/place step. In the exemplary embodiment shown in FIG. 4A, buffer shelves BA, BR may be provided in the interstitial modules 56A, 56, 30i to buffer workpieces transported along travel lanes A,R. the position and number of buffer shelves shown in FIG. 4A is merely exemplary, and in alternate embodiments the interstitial modules may have any desired number of buffer shelves positioned in any desired manner.

As noted before, in the exemplary embodiment, the travel lanes defined in the transport chamber 416 may have polarized travel directions respectively indicated by arrows A, R for the corresponding travel lanes. For example, travel direction along lane A, is "advance"/away from tool interface section 12, and the direction along lane R is "return"/towards the tool interface section 12. The travel direction for the respective lanes shown in FIG. 4A are merely exemplary, and in alternate embodiments the travel lanes may have different travel directions. As may be realized, the travel directions are schematically illustrated in FIG. 4A as away from/"advance" along lane A, and "return"/towards along lane R a desired reference location of the transport chamber (in this embodiment the tool interface section 12). This directional scheme is used through the description to indicate the travel direction along respective lanes A, R in the transport chamber regardless of transport chamber configuration (e.g. bends, corners, turns defined by the transport chamber, see FIGS. 5-6). In the exemplary embodiment shown, the travel direction of the respective lanes A, R is substantially constant through the transport chamber 416. For example, travel direction along lane A is away from interface 12 throughout chamber 416, and travel direction along lane R is towards interface 12 throughout the chamber. In alternate embodiments, different portions of the travel lane may have different travel directions (e.g. travel on part of a lane may be away from, and travel on an adjoining part of the travel lane may be towards the reference location). In the exemplary embodiment shown in FIG. 4A, the workpiece shelves 56S, 56S1, 56S2, 30S1, 30S2 may also be polarized in accordance with direction polarization of corresponding travel lanes A, R. For example, workpiece shelves 56S1, 30S1 (that are in this embodiment may be substantially aligned with travel lane A as noted before) may hold workpieces traveling along lane A, and workpiece shelves 56S2, 30S2 (substantially aligned with travel lane R) may hold workpieces traveling along lane R. Thus, when moving workpieces along lane A, the transport arms 26B, 26i may pick/place the workpiece on shelves 56S1, 30S1 corresponding to lane A, and when moving workpieces along lane R, transport arms 26B, 26i may pick/place the workpieces on shelves 56S2, 30S2. Similarly, the buffer shelves BA, Br of the interstitial modules 56, 30i in the exemplary embodiment, may also be polarized in accordance with direction polarization of corresponding travel lanes A, R. Buffer shelves BA may buffer workpieces traveling along lane A, and buffer shelves BR may buffer workpieces traveling along lane R. In the exemplary embodiment, workpieces may be transferred between travel lanes by indexing transport arms 26B, 26i as desired. Processing of workpieces with tool 410 may be performed for example by loading the workpieces in tool interface section 12. As may be realized, the workpieces may be carried to tool interface section 12 in a Carrier CAA. Transported by a desired AMHS system and docked with interface section 12 as described before and shown in FIG. 1. The workpieces may be loaded from the Carrier CAA into the transport chamber 416 of the tool by transport arm 15 via load lock 56A. The workpiece processing protocol may use process steps (provided by processing modules PM see FIG. 4) corresponding to, and hence disposed along travel lane A as described previously. The workpieces may be placed on shelve(s) 56S1 of load lock 56A, for travel along lane A. As noted before, load lock chamber may be a workstation module configured (similar to station 30M) also as a metrology station or a heating/cooling station. For example, one or more of the load lock work shelves (similarly buffer shelves BA, BR) may have heating/cooling elements for operating on substrates seated thereon. Accordingly when on the shelf the substrate may be heated/cooled. From load lock 56A, the workpiece(s) may be moved, with arms 26B, 26i, along and in the direction of travel lane A (e.g. away from tool interface section 12) to the desired process steps. In the exemplary embodiment shown in FIG. 4A, the direction of travel lane A moves workpieces away from tool interface section 12 and towards entry/exit station 412. As noted before, entry/exit station 412 may be used to remove processed workpieces if desired, and thus processes workpieces may be moved along and in the direction of travel lane a to station 412 for unloading from the tool. If the workpiece processing protocol calls for further processing with processing steps corresponding to and arrayed along travel lane R, the workpiece may be indexed from travel lane A to travel lane R as previously described and moved along and in the direction of lane R to the desired processing steps. If removal from the tool 410 is desired via interface section 12, the processed workpieces may be transported along lane R back to interface section 12 for offload.

Figure 4C:
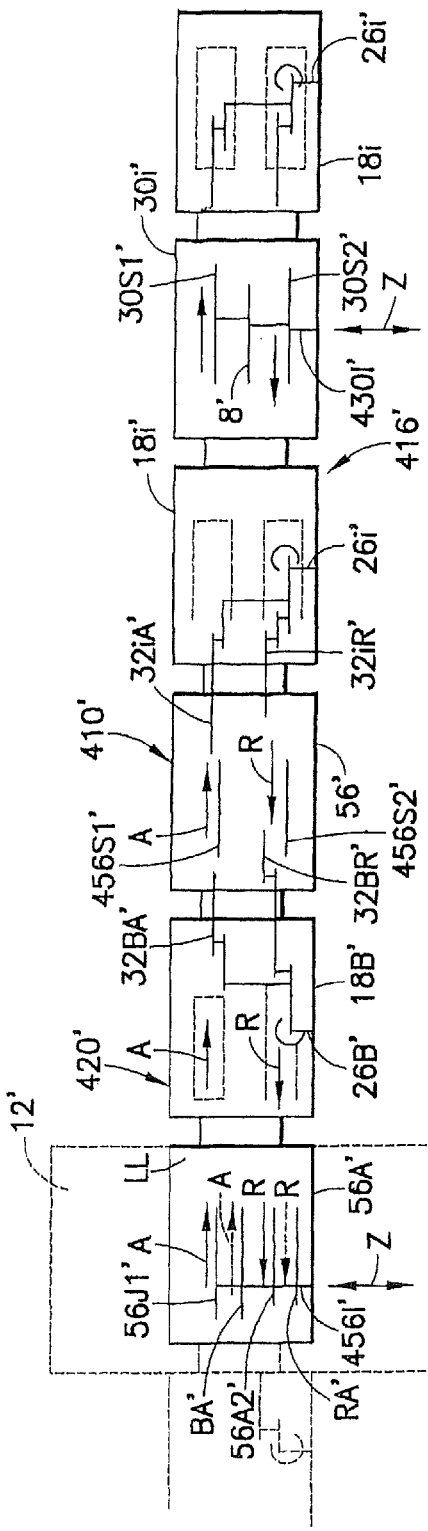
FIG. 4C is still another schematic elevation view of the transport chamber in accordance with another exemplary embodiment.

Referring now to FIG. 4C, there is shown a schematic cross sectional view of processing tool 410'. Tool 410' is similar to tool 410 (and tools 10, 310, 510) described previously, except as otherwise noted. Similar features are similarly numbered. Tool 410' may have a linear transport chamber 416' formed by transport chamber modules 18B', 18i' and interstitial modules such as load lock modules 56A', 56' and workpiece station 30i' serially connected together as shown. The transport chamber modules 18B', 18i' are similar to each other and the previously described transport chamber modules 18, 18A, 18B, 18i. Transport chamber modules 18B', 18i' have transport arms 26B', 26i. In the exemplary embodiment shown, the transport arms 26B', 26i' may be similar to each other and will be described in greater detail below with specific reference to arm 26B'. In alternate embodiments, the transport chamber modules may have transport arms with different configurations. Transport arm 26B' in this embodiment has a general scara arm configuration, similar to arm 26 seen best in FIG. 2 except as otherwise noted. In alternate embodiments, the transport arm may have any other desired configuration. As seen in FIG. 4C, in this embodiment arm 26B' may have multiple forearms (two are shown for example) each independently pivotally mounted to an upper arm (similar to mounting of forearm 26F to upper arm 26U shown in FIG. 2) and each having an end effector 32BA', 32BR' depending therefrom. Scara arm 26B' may have three (3) (e.g. independent rotation of upper arm about shoulder joint, (similar to shoulder 26S in FIG. 2), and independent rotation of each forearm about corresponding elbow joint (similar to elbow 26E in FIG. 2)) or five (5) degrees of freedom (e.g. similar to aforementioned three (3) degrees of freedom plus with independent rotation of each end effector about the wrist joint). In alternate embodiments, the arm may have more or fewer degrees of freedom. In the exemplary embodiment shown in FIG. 4C, transport arm 26B' may not be capable of indexing. In alternate embodiments, one or more of the transport arms in the transport chamber modules of the transport chamber may be capable of indexing. In the exemplary embodiment indexers 456I', 430I' may be located in interstitial modules. For example load lock module 56A' and workpiece station 30$i$' may each have a corresponding indexer 456I', 430I' located therein. The number and location of indexers in the transport chamber 416' shown in FIG. 4C is exemplary. In alternate embodiments, more or fewer modules with indexers may be provided. In other alternate embodiments, the interstitial module with indexers may be positioned in the transport chamber in any desired configuration. As seen in FIG. 4C, indexer 456I' may have workpiece shelves) supports 56S1', 56S2' that (similar to positionally static shelves 56S1, 56S2) cooperate with transport arm 26B' in the adjoining transport chamber module to transport workpieces through linear transport chamber 416'. In alternate embodiments, the indexer may have more or fewer shelves. Indexer 456I', in this embodiment may also have buffer shelves BA', BR' to buffer workpieces in load lock 56A'. The indexer 430I' in workpiece station 30$i$' is generally similar to indexer 456I' with, for example, workpiece shelves 30S1', 30S2' and buffer shelf B'. In alternate embodiments, the indexers may have any other desired configuration. In the exemplary embodiment, load lock module 56' may have workpieces support shelves 456S1', 456S2' that are positionally static. Workpiece support shelves 456S1', 456S2' may be substantially similar to workpiece shelves 56S1, 56S2 shown in FIG. 4A. In alternate embodiments, more or fewer interstitial modules of the transport chamber may have positionally static workpiece shelves as may be realized, the tool controller (similar to controller C in FIG. 5) may automatically register, as described before, which interstitial modules 56A', 56', 30$i$' has an indexer 456I', 430I' the operational parameters of the corresponding indexer (e.g. number and location of workpiece and buffer shelves of the respective indexer), and which interstitial modules may have static workpiece shelves (as well as relevant parameters of the shelves). Similarly, the tool controller may automatically register the configuration of the transport arms 26B', 26$i$' of the transport chamber modules (e.g. whether indexing capability, multiple forearms) and the relevant parameters for operation of the arms.

Still referring to FIG. 4C, the transport arms 26B', 26$i$', and workpiece shelves 56S1, 56S2, 30S1', 30S2' (on indexers 456I', 430I') and static workpiece shelves 456S1', 456S2' cooperate with each other and define distributed transport system 420' to effect workpiece transport through the transport chamber in the directions indicated by arrows A, R to that described before with respect to tool 410 in FIG. 4A. Transport system 420' is also arranged to define multiple travel lanes A, R. As may be realized, the motion of the end effectors 32BA', 32BR', 32$i$A', 32$i$R' (more specifically the plane of motion) establishes the position (e.g. the height location) of the travel lanes A, R. In the exemplary embodiment, end effectors 32BA', 32$i$A' of the transport arms 26B', 26$i$' locate travel lane A, and the other end effectors 32BR', 32$i$R' locate travel lane R. The static shelves 456S1,' 456S2' may respectively be substantially aligned with the travel lanes A, R. The workpiece and buffer shelves 56S1', 56S2', BA', BR', 30S1', 30S2', B on the indexers 456I', 430I' may be located as desired. The indexers 456I', 430I', may have sufficient indexing height to transit the workpiece shelves and buffer shelves between positions in substantial alignment with the travel lanes A, R. The indexers may have sufficient number of workpiece or buffer shelves to maintain a workpiece/buffer shelf aligned with each travel lane A, R regardless of index position of the indexer (as shown in FIG. 4C). This, as may be realized serves to disconnect indexer position from transport capacity. An appropriate shelf, of the indexer, to pick or place a workpiece may be correctly positioned for the arrival of the corresponding end effector so that end effector movement is not dependent on indexer position.

In the exemplary embodiment, the travel lanes A, R defined by transport system 420' in transport chamber 416', may have polarized travel directions. The travel direction convention used for travel lanes A, R in FIG. 4C is merely exemplary and similar to the convention in FIG. 4A (e.g. lane A travels away from tool interface section 12' and lane R travel towards tool interface 12'). In alternate embodiments, the travel lanes may be used for bi-directional travel. In this embodiment, the end effectors on arms 26B', 26$i$ corresponding to respective travel lanes may be polarized according to the direction polarization of the corresponding travel lanes. For example, end effectors 32BA', 32$i$A' may transport workpieces on lane A in the direction of lane A (e.g. away from interface section 12'), and end effectors 32 BR', 32$i$R' may transport workpieces on lane R in the direction of lane R (e.g. toward interface section 12'). The static workpiece shelves 456S1', 456S2' may also be polarized according to the directional polarization of the corresponding travel lanes as shown in FIG. 4C (and similar to shelves 56S1; 56S2 in FIG. 4A). Transition of workpieces between travel lanes A, R may be accomplished with indexers 456I', 430I'. As may be realized, in the exemplary embodiment, the transport arm 26B', 26$i$ may be provided with sufficient but limited Z motion to effect picking/placing workpieces onto static workpiece shelves 456S1', 456S2'. In alternate embodiments, the static shelves may have limited Z motion to allow picking/placing workpieces on the end effectors of the transport arm. Processing of workpieces with tool 410' may be accomplished in a similar manner to that described before with respect to tool 410 (see FIG. 4A) except that movement of workpieces between lanes A, R is effected with the indexers 456I', 430I'.

Figure 8:
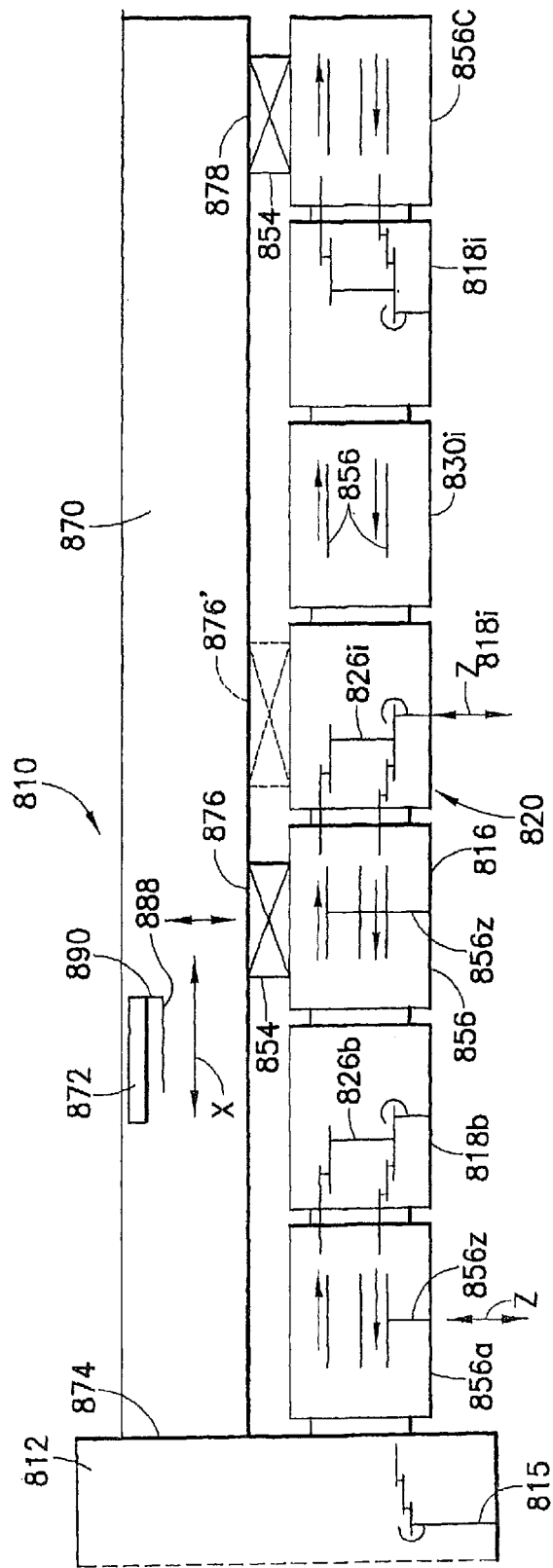
FIG. 8 is a schematic elevation view of the apparatus in accordance with another exemplary embodiment.

Referring to FIG. 8, there is shown another schematic elevation view of a tool 810 in accordance with another exemplary embodiment. Tool 810 is generally similar to tool 410' described before and shown in FIG. 4C. Tool 810 has transport chamber 816 that is substantially similar to transport chamber 416'. Transport chamber 816 may have a distributed transport system 820 defined by transport arms 826B, 826$i$ (similar to arms 26, 26A, 26B, 26B1), indexers 856I (similar to indexers 456I, 430I) and workpiece shelves 856S. The transport system 820 may have multiple travel lanes A, R along which workpieces are transported within the transport chamber. Travel lanes A, R may have polarized travel directions (similar to lane A, R in FIGS. 4A-4C). In the exemplary embodiment, tool 810 may have an "express" transit passage 870 similar to passage 570 described before and shown in FIG. 5. Similar to passage 570, passage 870 in this embodiment may be a linearly elongated tube capable of holding an isolated atmosphere (e.g. $N_2$, vacuum) or a controlled atmosphere (e.g. highly clean air). A vehicle or shuttle is located inside the tube as shown. The tube may be formed from modular tube sections (not shown). In alternate embodiments the transport chamber modules (similar to modules 818B, 818R) and interstitial modules (similar to modules 856A, 856, 856C) may have integral transit tube sections. Assembly of the modules to form the transport chamber simultaneously forms the continuous transit passage. The tube may have access openings/passages 876, 876' 878 as shown capable of communicating with modules 856, 818i, 856C. In alternate embodiments, the position of the passage 870 relative to the transport chamber 816 shown in FIG. 8 is exemplary, and the passage may be located in any desired position/orientation relative to transport chamber (e.g. above, below, to the side, etc.). The communication passages between tube and transport chamber may be located as described. In this embodiment passage 876 may be connected to a generally intermediate module 856, 818i of the transport chamber, and passage 878 may be connected to a module at an end or proximate an end of the transport chamber 816. In the exemplary embodiment, modules 856, 856C may be load lock modules, and module 818i may be a transport chamber module similar to module 18, 18i, 18i' described before. In this embodiment, transport arm 826i in module 818i may be capable of indexing in the Z direction sufficiently to transport workpieces between the transport chamber and shuttle 872 in the passage 870 through passage 876'. Also, the indexer 856I in load lock module 856 may be capable of indexing in the Z direction to effect transfer of workpieces between transport chamber and shuttle 872 in passage 870 through passage 876. Connecting passages 876, 876' 878 may be closable, for example with suitable actuable doors 854 to isolate the transport chamber interior from the atmosphere within the transit passage 870. Accordingly different atmospheres, gas species, and/or pressures may be maintained between the transit passage and transport chamber 816. For example, the passage 870 may have a controlled/purified high cleanliness air atmosphere, similar to (or shared with) an environmental interface section 812. The transport chamber as noted before may have portions holding a vacuum, inert gas, etc. commensurate to the processing steps. Workpiece transfer between transit passage and transport chamber without compromising the internal atmosphere is effected via loadlocks 856, 856C. Shuttle 872 is capable of traversing the length of the transit passage 570 in the direction indicated by arrow X1. Shuttle 872 may have any suitable vehicle/carriage configuration. Suitable examples of vehicles/carriages are described in U.S. patent application Ser. No. 10/624,987, incorporated by reference herein in its entirety. In alternate embodiments, the shuttle may be capable of movement, relative to the transit passage, in a movement plane (such as a horizontal or vertical plane). For example, in alternate embodiments, the transit passage may extend laterally (a direction substantially orthogonal to the passage longitudinal axis) to communicate with multiple (e.g. a row of laterally disposed) transport chambers, and the shuttle may traverse the length and breadth of the passage. As seen in FIG. 8, the shuttle 872 may have a grip or end effector 888 for holding a workpiece(s). In alternate embodiments, the shuttle grip may be capable of holding a cassette for storing a workpiece(s) and transport the workpiece(s) out of the tool. The shuttle 872 in the exemplary embodiment may have an integral indexer 890 capable of indexing (Z motion) the grip 888 in order to transfer the workpiece between transit passage 870 and transport chamber modules without a resident indexer, such as load lock 856C. As seen in FIG. 8, the transit passage may communicate through a suitable opening/passage 874 with tool interface section 812 (similar to tool interface section 12, 512 described before) which in this exemplary embodiment forms a workpiece entry/exit station for the transport chamber 816. As may be realized, workpieces may be loaded/unloaded from the shuttle 872 with the transport arm 815 of the interface section 812. Thus, transit passage 870 may provide an express by pass/return for workpieces processed in tool 810 in a similar manner to that described before regarding transit passage 570 in FIG. 5.

Figure 4D:
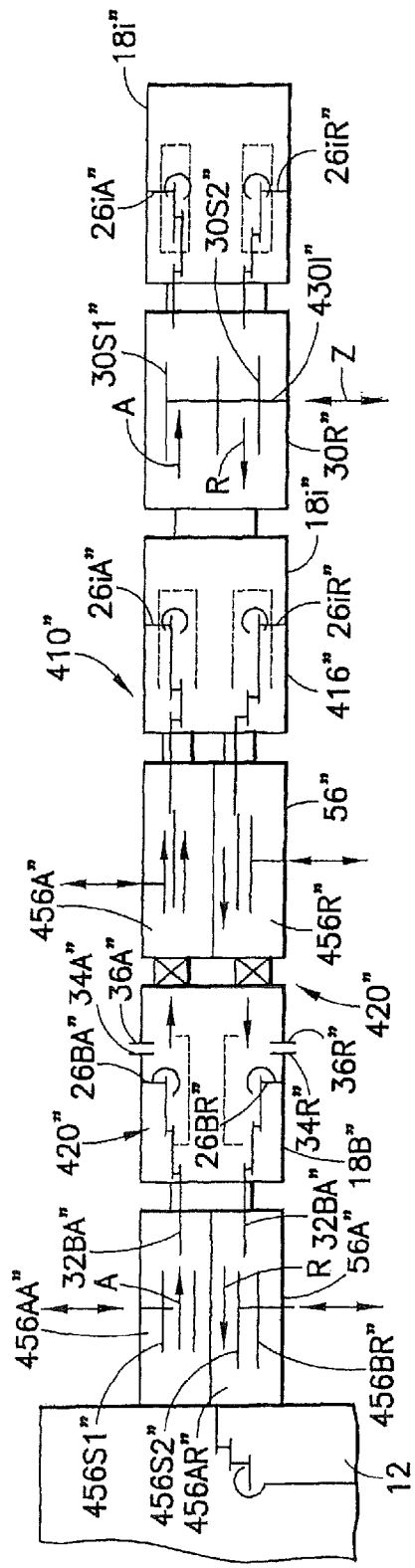
FIG. 4D is yet another schematic elevation view of the transport chamber in accordance with yet another exemplary embodiment.

Referring now to FIG. 4D, there is shown another schematic elevation view of a tool 410" in accordance with yet another exemplary embodiment. Tool 410" is generally similar to tool 410, 410' described before and shown in FIGS. 4A-4C. Tool 410" has a transport chamber 416" that is similar to transport chamber 416, 416' described before. Tool 410" may also have an express transit passage (not shown) similar to transit passage 870 shown in FIG. 8. As may be realized, express transit passages similar to passages 570, 870 (see FIGS. 5, 8) may be provided to any of the previously described embodiments of the processing tool 10, 310, 410, 410'. Transport chamber 416" may have transport chamber modules 18B", 18i" and interstitial modules 56A", 56", 30i" linearly arrayed for example in the manner shown in FIG. 4D. Transport system 420" is distributed through the transport chamber 416" as will be described further below. Transport chamber modules 18B", 18i" are, in this embodiment, similar to each other and except as otherwise noted below, also to transport chamber modules 18, 18B", 18i described previously. In alternate embodiments, the transport chamber modules may have different configurations. In view of the similarity, in this embodiment, the chamber modules 18B", 18i", will be described with specific reference to chamber module 18B". In the exemplary embodiment shown in FIG. 4D, the transport chamber module 18B" has multiple independent transport arms 26BA", 26BR". The transport arms 26BA", 26BR" may be independently mounted to the chamber module frame (similar to module frame 22F, see FIG. 2). FIG. 4D shows two (2) independently mounted arms 26BA", 26BR" for exemplary purposes, and in alternate embodiments there may be more than two transport arms independently mounted within the transport chamber module. The multiple transport arms 26BA", 26BR" may be mounted to different walls, sides within the transport chamber module. For example, as seen in FIG. 4D, the transport arms 26BA", 26BR" may be mounted to opposing walls, such as top and bottom walls, of the transport chamber module frame. In alternate embodiments, the transport arms may be mounted to opposing side walls, or to adjacent walls (such as one transport arm being mounted to a bottom wall and another transport arm being mounted to an adjacent side wall, or each transport arm being independently mounted to adjacent side walls) of the transport chamber module. In the exemplary embodiment, the transport arms 26BA", 26BR" in the transport chamber module 18B" may be substantially similar to each other, and will be described herein with specific reference to arm 26BA". In alternate embodiments, the transport arms independently mounted within the transport chamber module may be of different types. Transport arm 26BA", schematically shown in FIG. 4C, may be a scara type arm similar to transport arm 26 described before and shown in FIG. 2. The transport arm 26BA" may have two (2) or three (3) degrees of freedom movement (e.g. providing θ, r motion, see FIG. 2, of the end effector, 32BA". In alternate embodiments, the transport arm may also be capable of indexing (Z motion). In other alternate embodiments, the transport arm may have any other desired configuration. Transport arm 26BA" may have a modular configuration, similar to transport arm module 26M described before (see FIG. 2), allowing transport arm 26BA" (for example arm linkage and drive section) to be installed/removed from the transport chamber module 18B" as a modular unit. The transport arm 26BA" and transport chamber module frame may each have complementing position control features 34A", 36A" similar to features 34, 36 described before, (see FIG. 2) enabling repeatable positioning of the transport arm relative to the module. Similarly the other independently mounted transport arm(s) 26BR" in the transport chamber module may also have position control features 34R", 36R" to enable repeatable positioning of each transport arm relative to the module. In the exemplary embodiment shown in FIG. 4D, the position of the transport arms 26BA", 26BR" may allow the corresponding end effectors 32BA", 32BR" to move along different transport planes. In this embodiment, the transport planes, along which the end effectors translate may be related, for example workpieces may be transferred between transport planes, similar to transfer of workpieces between travel lanes A, R described before and also as will be described in greater detail below with specific reference to this exemplary embodiment. Accordingly, in this embodiment as may be realized, the position control features 36A", 36R" on the module frame (similar to frame 22F) corresponding to the respective transport arms 26BA" 26BR" may each be established from a common reference datum in a manner similar to position control features 36 (see also FIG. 9). This avoids generating over constraints on locating the transport arms, and hence the workpiece transport planes, relative to each other. Similarly, it avoids overconstraining the positioning of other transport chamber modules and interstitial modules during formation of the transport chamber 416", in the manner similar to that described before with respect to chamber 16.

Still referring to FIG. 4D, in this exemplary embodiment interstitial modules 56A", 56" may be load lock chambers. In the exemplary embodiment, modules 56A", 56" may be similar to each other, and hence will be described below with specific reference to module 56A". In alternate embodiments, the interstitial modules may have different load lock chamber configurations. As seen in FIG. 4D, module 56A" has multiple independently isolatable and independently operable load lock chambers 456AA", 456AR". FIG. 4D shows two (2) load lock chambers 456AA", 456AR" for example purposes. In alternate embodiments more load lock chambers may be provided as desired. Each load lock chamber 456AA", 456AR" may communicate independently with the transport chamber module 18B" and any other chamber module (e.g. tool interface station 12) between which the load lock chambers transitions. In this exemplary embodiment, the load lock chambers 456AA", 456AR" may be arrayed vertically, such as in a vertical stack. In alternate embodiments, the load lock chambers communicating with the transport chamber module may be vertically and horizontally offset. As noted before, the multiple load lock chamber 456AA", 456AR" may be incorporated into a common module 56A" thus allowing the multiple load lock chambers to be installed and removed, if desired, as a unit. Each load lock chamber 456AA", 456AR" may be configured for example as a sub-module capable of being mated to other load lock chamber submodules, such as in a vertical stack, to form a load lock chamber module assembly that may be for example connected to other transport chamber modules as an integral assembly. Individual load lock chamber submodules may also be separately mounted or removed from transport chamber. Each module 56A", and each load lock chamber sub-module, may have a suitable utilities interface (not shown), similar to interface/coupling 21 (see FIG. 2), for connecting the load lock chambers to the tool controller (similar to controller C, see FIG. 5) and other facilities, enabling the tool controller to automatically update the tool configuration and process protocol on installation or removal of the load lock module/sub-module from the tool. In alternate embodiments, the multiple load lock chambers may be integrally formed into a common module frame. In other alternate embodiments, each load lock chamber may be an independent module. As may be realized, the incorporation of multiple independently isolatable/operable load lock chambers 456AA", 456AR" provide "parallel" communication links between isolatable modules of the transport chamber such as transport chamber module 18B" and tool interface section 12. Here, the term "parallel" is not used to define specific spatial orientation of the communication links, and the travel paths of workpieces through each load lock chamber 456AA", 456AR" between interconnected modules 18B", 12 may not be spatially parallel. Rather "parallel" communication links here means communication links sharing common origin/destination modules and extending generally alongside each other. The availability of the "parallel" communication links allows discretization, or subdivision of communication between the isolated transport chamber modules 18B", 12 joined by multiple load lock chambers 456AA", 456AR" so that portions of the communication process (in other words the process of transiting workpiece between modules 18B", 12) may be performed substantially simultaneously. For example, the load lock chambers 456AA", 456AR" may each be substantially simultaneously communicating with a different atmosphere (e.g. chamber 456AA' may be open to tool interface section 12 and chamber 456AR" may substantially simultaneously be open to transport chamber module 18B"). Accordingly, the module 56A" joining transport chamber module 18B' to tool interface section 12 may be simultaneously loaded and unloaded (e.g. loading from one end, unloading from another, or loading from both ends, or unloading from both ends). As may also be realized, the subdivision of the net communication or transit volume (provided by module 56A") between interconnected modules 18B", 12 (due to the multiple load lock chambers 456A", 456AR") generates smaller pump down volumes as well as allowing substantial simultaneous differential cycling of the transit volume atmospheres (e.g. chamber 456AA" may be vented to interface section 12 and chamber 456AR" may be pumped down or vice versa). The result as may be realized is increased transport capacity of the transport chamber 416" and hence increased throughput of tool 410".

In the exemplary embodiment shown in FIG. 4D, each load lock chamber 456AA", 456AR" may have workpiece shelves for holding workpieces transiting through the respective load lock chambers between tool interface section and transport chamber module. For example, each load lock chamber 456AA" 456AR" may have (one or more) shelves 456S1", 456S2" (similar to shelves 56S1, 56S2, 56S1', 56S2', described before and shown in FIGS. 4A, 4C) that may cooperate with transport arms 26BA", 26BR" in the adjoining transport chamber module 18B" to transport workpieces through the transport chamber 416". In this exemplary embodiment, each load lock chamber 456AA", 456AR" may also have (one or more) buffer shelves 456BA", 456BR" for buffering workpieces similar to buffer shelves BA', RA' (see FIG. 4C). The workpiece shelves 456S1", 456S2" and buffer shelves 456BA", 456BR" may be mounted on an indexer (similar to indexer 456I') capable of the corresponding shelves in the Z direction relative to the respective load lock chamber. In this embodiment, each load lock chamber may have an indexer for indexing the workpiece and buffer shelves therein. In alternate embodiments, one or more of the shelves in the load lock chamber may be positionally static, and the transport arms in the transport chamber module may be capable of indexing. In other alternate embodiments, one or both of the transport arms may be capable of indexing sufficiently so that the arm(s) may access (load/unload) workpieces on one or more shelves in each load lock chamber. Similar to tools 410, 410', 810 described previously, the transport arms 26BA", 26BR", 26IA", 26IR" (in the transport chamber modules 18B', 18i") and shelves 456S1", 456S2" (in load lock chambers 456AA", 456AR", 456A", 456R") are arranged to define multiple travel lanes A, R in transport chamber 416" of tool 410". For example, transport arms 26BA", 26iA" in cooperation with the shelves 456 S1" (of interstitial load lock chambers 456AA", 456A") may define travel lane A along which workpieces may be transported through the linear transport chamber as well as to/from processing modules (similar to processing modules PMA, PMR, see also FIG. 4D) corresponding to travel lane A as previously described. Similarly, the transport arms 26BR", 26iR" in cooperation with the shelves 456S2" (of load lock chambers 456AR", 456R") may define travel lane R. As may be realized, buffer shelves 456BA", 456BR" may buffer workpieces along the corresponding travel lanes A, R.

In the exemplary embodiment shown in FIG. 4d, an interstitial module 30i" may have an indexer 430I". Indexer 430I" is substantially similar to indexer 430I' described before and shown in FIG. 4C. Indexer 430I" may have workpiece shelves 30S1", 30S2" and one or more buffer shelves. The indexer 430I" may be capable of traversing the shelves between the travel lanes A, R and may thus define a switch allowing workpieces to be switched from one travel lane to another. In alternate embodiments, the transport chamber may have more switches, and the switches may have any desirable configuration. Travel lanes A, R in the exemplary embodiment may have polarized travel directions. Accordingly, the transport arms and workpiece shelves corresponding to respective travel lanes A, R may be polarized according to the direction polarization of the corresponding travel lanes. By way of example, transport arms 26BA", 20iA" and shelves 456S1", 456BA" may transport workpieces on lane A in the dedicated direction of lane A (e.g. away from tool interface section 12 in the exemplary embodiment shown in FIG. 4D). The transport arms 26BR", 26iR" and shelves 456S2", 456BR" may transport workpieces on lane R in the dedicated direction of lane R (e.g. towards tool interface section 12). As may be realized, workpieces may switch travel directions (e.g. from the direction of lane A to the direction of lane R, or vice versa) by switching travel lanes, for example via indexer 430I" in module 30i" as described before.

Figure 7:
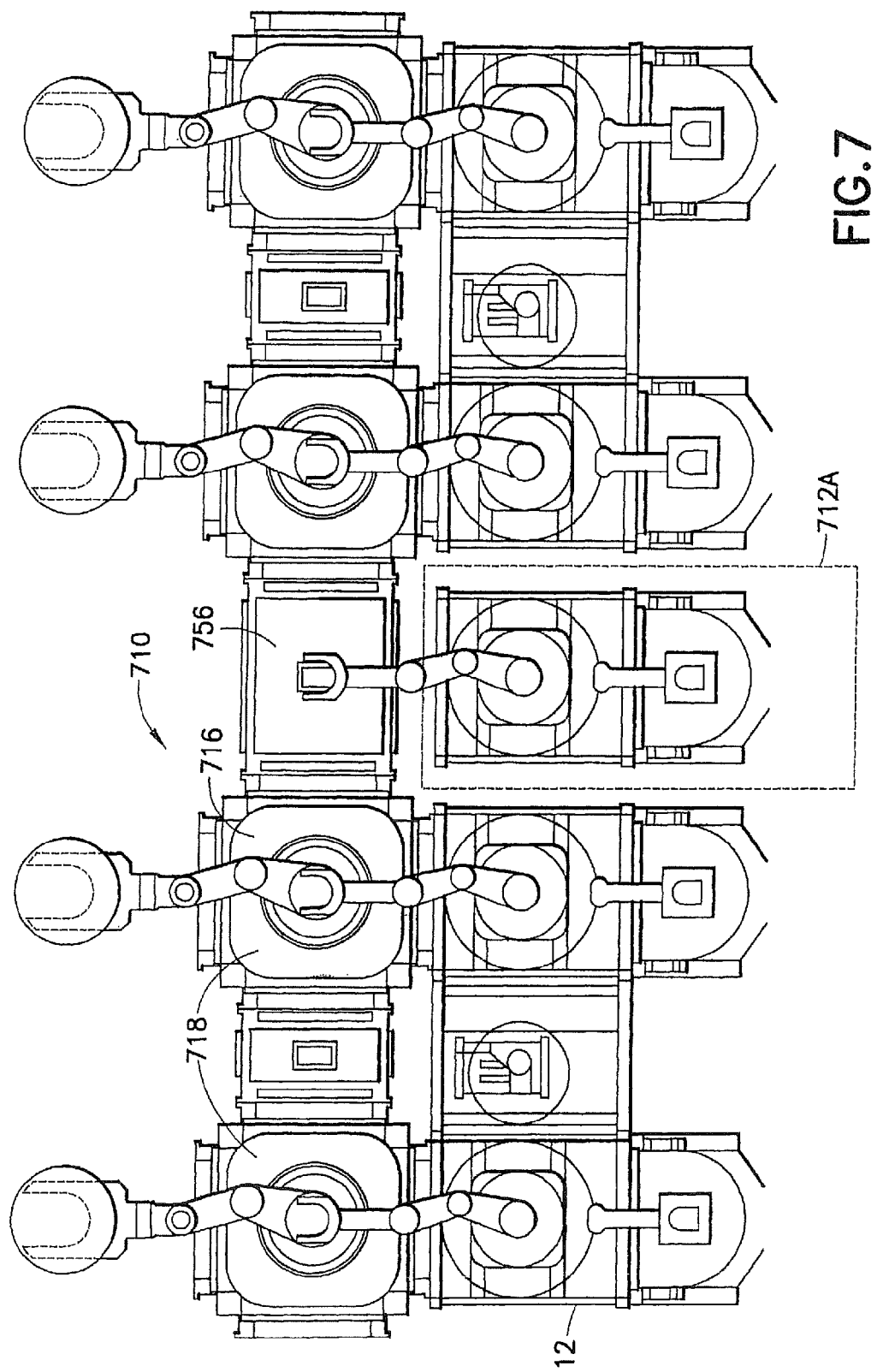
FIG. 7 is a still another schematic plan view of the processing apparatus in accordance with another exemplary embodiment.

As may be realized from the exemplary embodiments described herein, the tool 10, 310, 410, 410', 410", 810 is scalable and may be increased or reduced in size by adding or removing modules as desired. The tool may also be provided with any desirable configuration by connecting modules to form the transport chamber in the desired configuration. This is illustrated in the exemplary embodiment shown in FIG. 7. Tool 710 in this embodiment is substantially similar to the tools 10, 30, 410, 410', 810 in the other previously described embodiments. Tool 710 has a linear transport chamber 716. Tool interface sections 12, 712A may be joined to any transport chamber module 718, in any location or to any interstitial module 756. Similarly any other module (e.g. transport chamber module, interstitial module, processing module, etc.) may be joined, or removed, to the transport chamber modules, in a building block like manner, to provide the tool with the desired configuration. The controller, as described before automatically updates the tool configuration and process protocol for the resulting tool.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate processing apparatus comprising:
 a transport chamber capable of holding an isolated atmosphere therein and communicably connected to a charging station for loading and unloading a substrate into the apparatus;
 a transport system inside the transport chamber for transporting the substrate; and
 an array of processing chamber modules distributed alongside the transport chamber and communicably connected to the transport chamber to allow the substrate to be transferred therebetween;
 wherein the transport chamber is capable of being linearly elongated longitudinally and comprises:
 at least one transport chamber node, each of which includes control features having a predetermined relationship with a node reference datum and being established based on a global reference datum of the substrate processing apparatus where the control features are configured so that the at least one transport chamber node is fully interchangeable with other different ones of the at least one transport chamber node and defining position deterministic features that finally position and align a respective transport chamber node coincident with installation enabling the transport system handling of substrates through the transport chamber and so that each of the at least one transport chamber node is capable of being communicably connected in series to at least another transport chamber node of the transport chamber through the control features for effecting the elongation, and of tying at least two chamber modules of the apparatus to each other on a common side of each of the at least one transport chamber node and optionally on opposite sides of each of the at least one transport chamber node, each node having a resident substrate transport arm therein for transporting the substrate between the transport chamber node and the at least two chamber modules; and
 a substrate buffer, communicably connected to the at least one transport chamber node, buffering the substrate.

2. The apparatus of claim 1, wherein the substrate buffer comprises shelves for buffering the substrate and an indexer for moving the shelves, where the shelves are configured such that a shelf is aligned with a travel lane of the transport system regardless of indexer position for effecting maximum substrate transport throughput through the transport chamber at a predetermined travel rate of the transport system.

3. The apparatus of claim 1, wherein the substrate buffer is a pass through buffer and buffers the substrate between the at least one transport chamber node and the at least other transport chamber node.

4. The apparatus of claim 1, wherein the substrate buffer has a vacuum pump.

5. The apparatus of claim 1, wherein the charging station has a substrate transport container interface and a port through which the substrate is transferred between the apparatus and a transport container.

6. The apparatus of claim 1, wherein at least one of the two chamber modules is a substrate processing chamber module.

7. The apparatus of claim 1, wherein at least one of the two chamber modules is the at least another transport chamber node.

8. The apparatus of claim 1, wherein the at least one transport chamber node is capable of being isolated from each of the at least two chamber modules.

9. The apparatus of claim 1, wherein the at least one transport chamber node has a substrate transfer opening corresponding to each of the at least two chamber modules, each opening being adapted to allow transfer of the substrate through the opening between the at least one transport chamber node and the chamber module.

10. The apparatus of claim 9, wherein the substrate transfer opening is closable to isolate the node from the chamber module.

11. The apparatus of claim 1, wherein the at least one transport chamber node has a housing capable of holding an isolated atmosphere therein, isolated from at least one of the two chamber modules.

12. The apparatus of claim 1, wherein the at least one transport chamber node is selectable from a number of different interchangeable transport chamber nodes configured so that the transport chamber nodes are interchangeable substantially without adjustment of mating interfaces of the transport chamber nodes at installation.

13. The apparatus of claim 12, wherein the transport chamber has a predetermined reference datum and the at least one transport chamber node has positioning features related to the reference datum for repeatably positioning the at least one transport chamber node relative to the reference datum.

14. The apparatus of claim 1, wherein the at least one transport chamber node is adapted to allow the at least two chamber modules to be joined to the at least one transport chamber node on adjoining sides of the node.

15. The apparatus of claim 1, wherein the substrate transport arm has an end effector for holding and transporting the substrate, the substrate transport arm being capable of moving the end effector from the at least one transport chamber node to each of the at least two processing chamber modules.

16. The apparatus of claim 1, further comprising a controller controllably connected to the transport chamber, transport system and array of processing modules, wherein the controller has a distributed control cluster architecture.

17. The substrate processing apparatus of claim 1, further comprising a controller communicably connected to the transport chamber and/or one or more processing chamber modules wherein, at least one of the one or more processing chamber modules has an electronic interface programmed to automatically identify a predetermined characteristic of the at least one transport chamber node to the controller upon interface with the controller.

18. A substrate processing apparatus comprising:
a transport chamber with an opening for loading and unloading a substrate to and from the transport chamber, the transport chamber comprising a first transport chamber module, a second transport chamber module and a third transport chamber module, each of the first, second and third transport chamber modules each including control features having a predetermined relationship with a respective transport chamber module reference datum and being established based on a global reference datum of the substrate processing apparatus where the control features are configured such that the first, second and third transport chamber modules are fully interchangeable with each other and define position deterministic features that finally position and align a respective transport chamber module coincident with installation enabling transport system handling of substrates through the transport chamber and capable of holding an isolated atmosphere therein and each of the first, second and third transport chamber modules is communicably connectable to each other for transferring the substrate therebetween, and when the first and second transport chamber modules are connected to each other, the transport chamber has a longitudinal linearly elongated shape;
the transport system located in the transport chamber and having a substrate transport arm movably mounted in a longitudinally fixed location within each of the first, second and third transport chamber modules;
an array of processing chamber modules distributed alongside the transport chamber and communicably connected to the transport chamber to allow the substrate to be transferred therebetween; and
at least one substrate buffer module selectably connectable to at least one of the first, second or third transport chamber modules;
wherein the longitudinal linearly elongated shape of the transport chamber has a selectably variable longitudinal length effected by selectable connection of at least one of the second and the third transport chamber modules to the first transport chamber module, wherein selectable connection of the third transport chamber module to either the first or second transport chamber modules depends on the substrate buffer module being connected between the first and second transport chamber modules.

19. The apparatus of claim 18, wherein the buffer module is a pass through buffer module.

20. A substrate processing apparatus comprising:
a charging station with a port for loading and unloading a substrate from the apparatus;
a transport chamber capable of holding an isolated atmosphere therein and communicably connected to the charging station to allow passage of the substrate in between;
a transport system inside the transport chamber for transporting the substrate; and
an array of processing chamber modules distributed alongside the transport chamber and communicably connected to the transport chamber to allow the substrate to be transferred therebetween;
wherein the transport chamber is capable of being linearly elongated longitudinally and comprises:
at least one transport chamber module, with an always resident substrate transport arm therein, the at least one transport chamber module being interfaced and communicably connected to the charging station and capable of being communicably connected to at least another transport chamber module, each of the charging station, the at least one transport chamber module and the at least another transport chamber module are arranged in series longitudinally, the at least one transport chamber module and the another transport chamber module each including control features having a predetermined relationship with a respective transport chamber module reference datum and being established based on a global reference datum of the substrate processing apparatus where the control features are configured such that the at least one transport chamber module and the another transport chamber module are fully interchangeable with each other and other different ones of the at least one transport chamber module and define position deterministic features that finally position and align a respective transport chamber module coincident with installation enabling transport system handling of substrates through the transport chamber; and a pass through substrate buffer, interfaced and communicably connected to the at least one transport chamber module so that the at least one transport chamber module is interposed between the charging station and the pass through substrate buffer.

21. The apparatus of claim 20, wherein the at least one transport chamber module is interfaced and communicably connected to at least one of the array of processing chamber modules.

22. The apparatus of claim 20, wherein the at least another transport chamber module comprises two other transport chamber modules and the transport chamber further comprises another pass through substrate buffer communicably connected to and located between and in longitudinal series with the two other transport chamber modules.

23. A substrate processing apparatus comprising:

a transport chamber module with a chamber capable of being isolated from outside atmosphere, and having a transport arm mounted inside the chamber, the transport arm having an end effector for holding and transporting a substrate, and having a pivot joint located in a substantially fixed location relative to the transport chamber module;

another transport chamber module, with another chamber capable of being isolated from outside atmosphere, and having another transport arm mounted inside the other chamber, the other transport arm having another end effector for holding and transporting the substrate, and having another pivot joint located in a substantially fixed location relative to the other transport chamber module, the other transport chamber module being connectable to the transport chamber module to form a linearly elongated transport chamber, the transport chamber module and the other transport chamber module each including control features having a predetermined relationship with a respective transport chamber module reference datum and being established based on a global reference datum of the substrate processing apparatus where the control features are configured such that the at least one transport chamber module and the another transport chamber module are fully interchangeable with each other and other different transport chamber modules of the substrate processing apparatus and define position deterministic features that finally position and align a respective transport chamber module coincident with installation enabling transport system handling of substrates through the transport chamber modules; and a linear array of processing modules extending along and connected to the linearly elongated transport chamber so that the substrate may be transported between the linearly elongated transport chamber and at least one processing module of the linear array;

wherein the transport arm and the other transport arm cooperate with each other to form a travel lane, extending longitudinally through the linearly elongated transport chamber, along which the substrate is transported.

24. A substrate processing apparatus comprising:

a transport chamber capable of holding an isolated atmosphere therein and communicably connected to a charging station for loading and unloading a substrate into the apparatus;

a transport system inside the transport chamber for transporting the substrate; and the transport chamber having a plurality of sealable ports distributed along the sides of the transport chamber, the plurality of sealable ports being configured to communicably connect the transport chamber to at least one processing chamber module to allow the substrate to be transferred therebetween;

wherein the transport chamber is capable of being linearly elongated longitudinally and comprises:

at least one transport chamber module, each of which includes control features having a predetermined relationship with a module reference datum and being established based on a global reference datum of the substrate processing apparatus where the control features are configured so that the at least one transport chamber module is fully interchangeable with other different ones of the at least one transport chamber module and defining position deterministic features that finally position and align a respective transport chamber module coincident with installation enabling the transport system handling of substrates through the transport chamber and so that each of the at least one transport chamber module is capable of being communicably connected in series to at least another transport chamber module of the transport chamber through the control features for effecting the elongation, and joining of at least two other chamber modules to the at least one transport chamber module on a common side of the at least one transport chamber module and optionally on opposite sides of the at least one transport chamber module, each transport chamber module having a resident substrate transport arm therein for transporting the substrate between the transport chamber module and the at least one other module; and a substrate buffer, communicably connected to the at least one transport chamber module, buffering the substrate.

* * * * *